US006243855B1

United States Patent
Kobayashi et al.

(10) Patent No.: US 6,243,855 B1
(45) Date of Patent: Jun. 5, 2001

(54) MASK DATA DESIGN METHOD

(75) Inventors: Sachiko Kobayashi, Ichikawa; Taiga Uno, Kawasaki; Kazuko Yamamoto, Tokyo; Koji Hashimoto, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/161,959

(22) Filed: Sep. 29, 1998

(30) Foreign Application Priority Data

Sep. 30, 1997 (JP) .................................. 9-266599

(51) Int. Cl.$^7$ .............................. G06F 7/60; G06F 17/10; G03F 9/00; G03C 5/00
(52) U.S. Cl. .................................. 716/19; 430/5; 430/30
(58) Field of Search ................................. 716/19

(56) References Cited

U.S. PATENT DOCUMENTS

| 4,895,780 | 1/1990 | Nissan-Cohen et al. |
| 5,553,274 | 9/1996 | Liebmann . |
| 5,879,844 | * 3/1999 | Yamamoto et al. .................... 430/30 |
| 5,920,487 | * 6/1999 | Reich et al. .......................... 364/491 |
| 6,004,701 | * 12/1999 | Uno et al. ............................... 430/5 |
| 6,071,658 | * 6/2000 | Wu et al. .............................. 430/30 |
| 6,077,310 | * 6/2000 | Yamamoto et al. .................... 716/19 |

OTHER PUBLICATIONS

Barouch, E. et al., OPTIMASK: An OPC Algorithm for Chrome and Phase–Shift Maks Design, Proc., SPIE—Int. Soc. Opt. Eng. (USA) vol. 22440, pp. 192–206, (1995).

Cobb, N., et al., Fast Sparse Aerial Image Calculation for OPC, Proc. SPIE–Int. Soc. Opt. Eng. (USA) vol. 2621, pp. 534–545, (1995).

Kawamura, E., et al., Simple Method of Correcting Optical Proximity Effect on 0.35 $\mu$m Logic LSI Circuits, Jpn. J. Appl. Phys., vol. 34, pp. 6547–6551, (1995).

Liebmann, L., et al., Optical Proximity Correction, A First Look At Manufacturability, Proc. SPIE–Int. Soc. Opt. Eng. (USA) vol. 2440, pp. 192–206, (1995).

Liebmann et al., "Optical Proximity Correction, a First Look at Manufacturability," SPIE (1994), 2322:229–238.

Barouch et al., "OPTIMASK: An OPC Algorithm for Chrome and Phase–Shift Mask Design," SPIE (1995), 2440:192–206.

* cited by examiner

*Primary Examiner*—Matthew Smith
*Assistant Examiner*—A. M. Thompson
(74) *Attorney, Agent, or Firm*—Finnegan, Henderson, Farabow, Garrett & Dunner, L.L.P.

(57) ABSTRACT

A correction target segment extracted from the design pattern is divided into lengths suited for correction. If the arrangement of the divided segments is a one-dimensional pattern, a correction value is obtained by conducting a one-dimensional process simulation to an arrangement within a predetermined distance from a divided segment in perpendicular direction. If the arrangement of the divided segments is a two-dimensional pattern, a correction value is obtained by two-dimensionally extracting a pattern included in a rectangular region having a predetermined distance from one point on the divided segment in perpendicular and horizontal directions and by conducting a two-dimensional process simulation to the extracted pattern.

18 Claims, 16 Drawing Sheets

MASK DATA DESIGN METHOD

BACKGROUND OF THE INVENTION

The present invention relates to photolithography applied to, for example, the manufacture of semiconductor integrated circuits and liquid crystal panels. The present invention relates to, in particular, a mask data design method and a mask data design apparatus for conducting automatic correction processing and to a recording medium capable of reading a computer storing mask data design procedures.

In photolithography for manufacturing a semiconductor integrated circuit, as the integration of devices mounted on a wafer is higher and a design rule is narrower, the problem of so-called an optical proximity effect attracts more attention.

The "optical proximity effect" is a phenomenon that a design pattern cannot be transferred onto a wafer with a desired shape and size. The optical proximity effect is a term originally used to mean the effect of light during transfer operation. It has now been used to generally means the effect which occurs throughout wafer process.

To attain desired device performance, it is necessary to realize the desired size and form of a design pattern on a wafer even if the optical proximity effect occurs. In recent years, optical proximity effect correction or OPC which corrects a process bias on a mask in advance, has been studied vigorously since it is considered effective to correct the optical proximity effect.

To make OPC effectively to a large-scale layout, it is required to automatically execute OPC processing on a computer. Various methods have been conventionally proposed for such automatic OPC processing. They include "OPTIMASK: An OPC algorithm for chrome and phase-shift mask design" in Proc. SPIE-Int. Soc. Opt. Eng. (USA) vol. 2440: pp. 192–206 (1995); "Optical Proximity Correction, a First Look at Manufacturability" in Proc. SPIE-Int. Soc. Opt. Eng. (USA) vol. 2,322, pp. 229–238 (1994); "Simple Method of Correcting Optical Proximity Effect for 0.35 $\mu$m Logic LSI Circuits" in Jpn. J. Appl. Phys. vol. 34 (1995), pp. 6,547–6,551, Part 1, No. 12B, December 1995; and "Fast Sparse Aerial Image Calculation for OPC" in Proc. SPIE-Int. Soc. Opt. Eng. (USA) vol. 2,621: pp. 534–545 (1995).

Mask data design using the conventional OPC method, however, employs a single correction method to all design patterns. This disadvantageously requires great time for correction calculation and, in some cases, accurate corrections cannot be made depending on the shape and arrangement of a mask pattern.

BRIEF SUMMARY OF THE INVENTION

The present invention has been made in the above circumstances. It is therefore the first object of the present invention to provide a mask data design method capable of obtaining mask data which has been subjected to optical proximity effect correction, at high speed and high accuracy.

It is the second object of the present invention to provide a mask data design method capable of making appropriate corrections at high speed by changing correction methods in accordance with characteristics of the spatial arrangement of a pattern including a correction target segment.

It is the third object of the present invention to provide a one-dimensional rule for appropriately classifying characteristics of the spatial arrangement of a pattern.

It is the fourth object of the present invention to provide a method for dividing a noted segment into lengths suited for correction in order to make appropriate corrections in a mask data design method according to the present invention.

It is the fifth object of the present invention to provide a mask data design apparatus for realizing the above method.

It is the sixth object of the present invention to provide a recording medium which can read by a computer storing procedures for the computer to execute the above method.

To achieve the above objects, the present invention has the following aspects.

(1) According to the first aspect of the present invention, there is provided a mask data design method correcting a design pattern and using the corrected design pattern as mask data to improve fidelity of a transferred pattern, obtained by transferring onto a wafer a pattern formed on a mask based on the design pattern, to the design pattern, the method comprising the steps of:

extracting a correction target segment from the design pattern;

dividing the extracted segment into lengths suited for correction;

determining whether characteristics of spatial arrangement of a divided segment complies to a predetermined one-dimensional rule; and classifying, if the characteristics of spatial arrangement of the divided segment complies to the predetermined one-dimensional rule, the divided segment as a one-dimensional pattern and, if not comply, classifying the divided segment as a two-dimensional pattern.

Correcting the divided segment in accordance with classified pattern types.

With this structure, it is possible to apply correction methods suited for correction target segments by correcting the correction target segments, which have been obtained by extraction, division and classification from the design pattern, in accordance with classified pattern types.

It is preferable that the characteristics of the spatial arrangement of the divided segment are dimensions of the divided segment, dimensions of an adjacent segment located within a predetermined distance S from the divided segment in perpendicular direction and positional relationship between the divided segment and the adjacent segment.

It is also preferable that, in the step of dividing the segment, while a pattern located within a predetermined distance R from a noted segment in perpendicular direction being observed, the noted segment is divided such that a length of a segment after being divided is not shorter than a predetermined length L based on an intersection between perpendicular lines drawn to the noted segment from topmost vertices of the pattern or based on the adjacency of the intersection.

It is preferable that the standards described in claims 10 through 14 are used as the one-dimensional rule.

(2) According to the second aspect of the present invention, there is provided a mask data design apparatus characterized in that, in the mask data design method described in (1) above, the step of correcting the divided segment includes the steps of: obtaining, if the characteristics of the spatial arrangement of the divided segment is classified as a one-dimensional pattern, a correction value for the divided segment by conducting one of a one-dimensional process simulation, a one-dimensional pattern transfer test and a combination of the one-dimensional process simulation and the one-dimensional pattern transfer test for a certain region including the segment; and obtaining, if the characteristics of the spatial arrangement of the divided segment is classified as a two-dimensional pattern, a correction value for the divided segment by conducting one of a two-dimensional process simulation, a two-dimensional pattern transfer test and a combination of the two-dimensional process simulation and the two-dimensional pattern transfer test for a certain region including the segment.

With this structure, it is possible to correct most of the correction target edges one-dimensionally. Due to this, if a simulator is used for calculating a correction value, it is possible to process correction value calculation at high speed and with a little volume of data. If a test is used, it is possible to easily obtain a correction value with a SEM (scanning electron microscope) or by measuring electrical characteristics. As for a pattern which cannot be one-dimensionally approximated, a correction value is obtained using a two-dimensional simulation or a test, thereby making highly accurate correction possible.

In this case, it is preferable that the step of correcting the divided segment further includes the step of, while using a database storing characteristics of spatial arrangement of segments and correction values corresponding to the segments, taking out a correction value suited for the divided segment from the database and correcting the divided segment if the characteristics of the spatial arrangement of the divided segment is stored in the database.

With this structure, it is possible to store the result of simulations already conducted into the database. It is also possible to obtain a correction value without conducting a simulation or the like if the characteristics of the spatial arrangement of the divided segments are already stored in the database.

(3) According to the third aspect of the present invention, there is provided a mask data design method according to (1) above, characterized in that, in the step of correcting the divided segment, if a plurality of divided segments are densely located, a correction calculation is conducted to a region including the plurality of dense segments.

With this structure, if the segments for calculating correction values are not densely located, a calculation such as a simulation is conducted for calculating a correction value per region corresponding to each segment. If densely located, a simulation is conducted for calculating correction values to a larger region which effectively contains regions corresponding to the respective segments. By so doing, it is possible to prevent the gross floor area of the region for calculating correction values to a minimum and to thereby realize high-speed processing.

(4) According to the fourth aspect of the present invention, there is provided a mask data design method according to (2) above, wherein if the certain region including the divided segment classified as a one-dimensional pattern overlaps with the certain region including the divided segment classified as a two-dimensional pattern, one of the two-dimensional process simulation, the two-dimensional pattern transfer test and the combination of the two-dimensional process simulation and the two-dimensional pattern transfer test is conducted to at least the overlapping region and a correction value for the divided segment is thereby obtained.

With this structure, by subjecting the region to a two-dimensional correction which is higher in accuracy than a one-dimensional correction, the accuracy of the mask data improves.

(5) According to the fifth aspect of the present invention, there is provided a mask data design apparatus for executing the above-stated mask data design procedures.

(6) According to the sixth aspect of the present invention, there is provided a recording medium capable of being read by a computer which stores the above-stated mask data design procedures.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
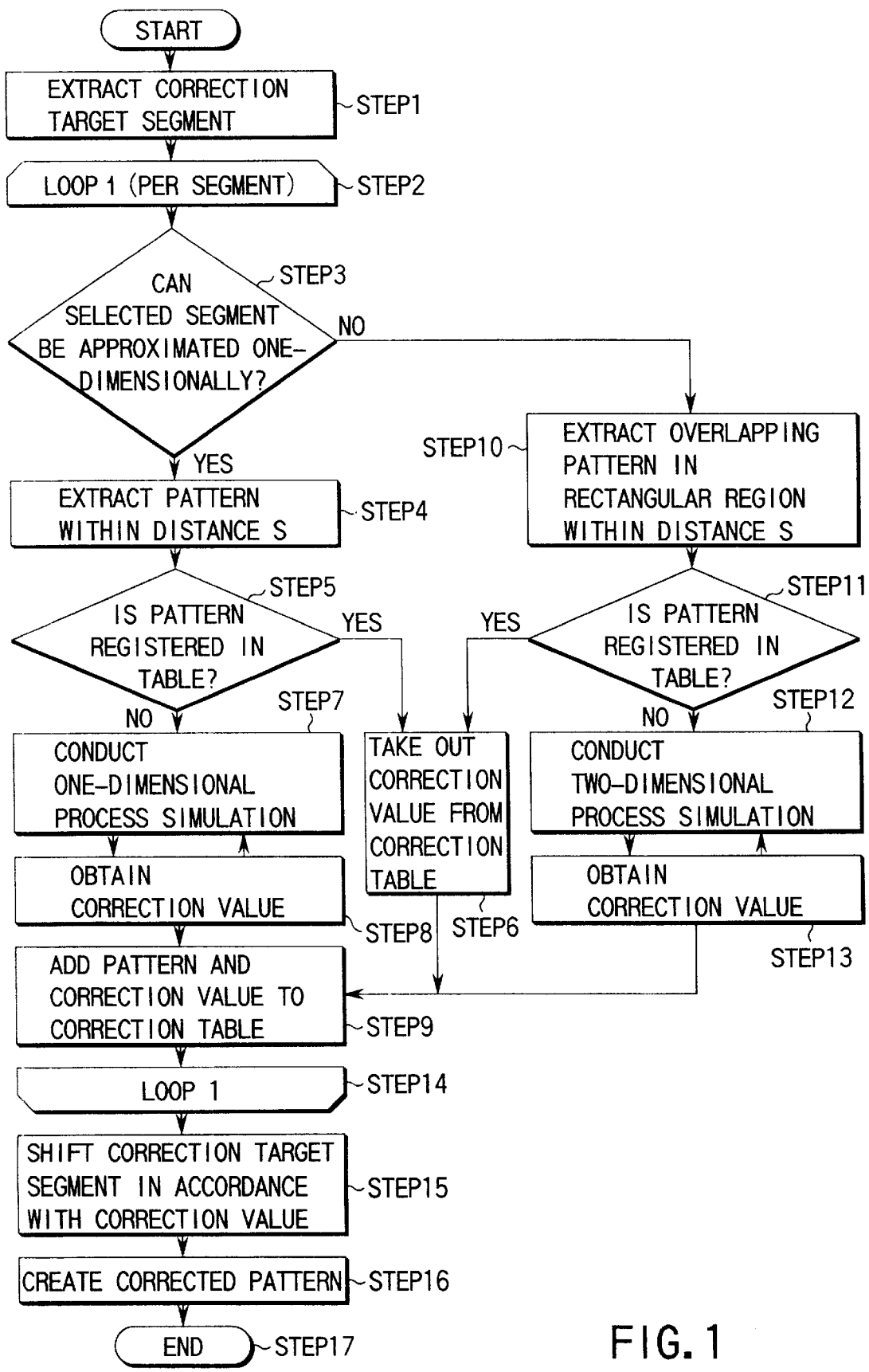
FIG. 1 is a flow chart showing a mask data design method in the first embodiment according to the present invention.

Detailed description of the present invention will be given with reference to embodiments as shown in the drawings.

[First Embodiment]

Figure 2:
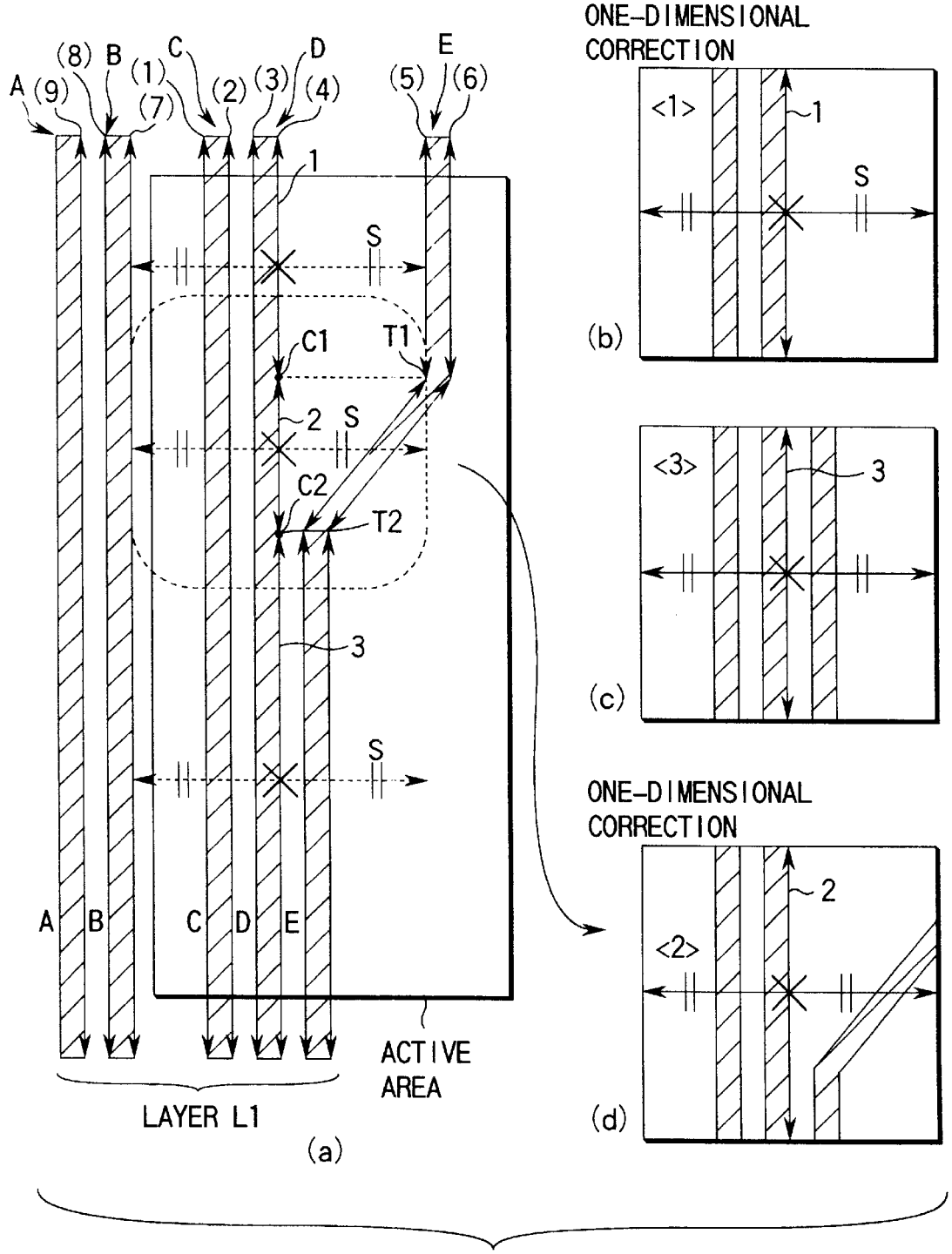
FIG. 2 shows pattern data used in the first embodiment.

FIG. 1 is a flow chart showing a mask data design method in the first embodiment according to the present invention. Processing steps in accordance with this flow chart will be described, taking a case a layout shown in FIG. 2 as an example.

In this embodiment, correction target segments are first extracted from a layout. In extraction, the correction target segment may be extracted per hierarchical management unit using hierarchical management followed by correction processing.

In this case, correction target segments are extracted from the layout shown in FIG. 2(a) (STEP 1). In this embodiment, a layer L1 including patterns A to E within the layout is defined as a correction target layer. Among the patterns A to E included in the layer L1, the patterns C to E overlapping with an active region are correction target patterns. Furthermore, edges (1) to (6) of the patterns C to E overlapping with the active region are selected as correction target segments.

Next, the correction target segments (1) to (6) are divided into lengths suited for correction, respectively. Appropriate algorithms provided as another aspect of the present invention can be utilized as a division method. In this embodiment, a division method based on topmost vertices of patterns adjacent to the correction target segments is employed.

If a segment (4) is a noted segment, for example, an adjacent pattern (segment) (5) existing within a predetermined distance S from the target segment (4) in perpendicular (or rectilinear) direction is discovered. Intersections C1 and C2 (or their adjacency) between the segment (4) and perpendicular lines drawn onto the noted segment (4) from topmost vertices T1 and T2 of the segment (5) are set as division points. At this time, the length of each divided segment is set to be not shorter than a predetermined length. In this case, the segment indicated by full line having arrows on both ends is a division segment.

In addition, even if a pattern does not overlap with the active area, segments (segments (7), (8) and (9) of the pattern B in this case) within the predetermined distance S from the segments included in the active area are to be divided, and also corrected.

Next, division segments are selected one by one in STEP 2. It is determined whether a selected segment in STEP 3 can be one-dimensionally approximated based on a "one-dimensional rule" which will be described later (STEP 3).

In this embodiment, description will be given, taking division segments 1, 2 and 3 of the segment (4) of the pattern D as examples.

In determination in the STEP 3, (one of or a combination of the following conditions (a) to (d) is used) as a condition for determining that the arrangement of the division segments 1, 2 and 3 cannot be approximated one-dimensionally i.e. "one-dimensional rule". In this embodiment, (b) is used as a one-dimensional rule. Other determination conditions will be described from the second embodiment forward.

(a) The length of a division noted segment falls within a predetermined range.
(b) An adjacent segment within a distance R from the noted segment in perpendicular direction is arranged in neither perpendicular nor parallel direction to the target segment.
(c) A noted segment is arranged in neither perpendicular nor parallel direction to the mask data design coordinate axis.
(d) When a pattern including a noted segment is separated into a rectangle and a triangle, the ratio of length to width of the rectangle including the noted segment falls within a predetermined range.

In this embodiment, based on the condition (b) above, it is determined that the segments 1 and 3 can be one-dimensionally approximated and the segment 2 cannot.

In case one-dimensional approximation is possible (segments 1 and 3), the process is moved on to a one-dimensional correction routine (STEPs 4 to 9). In case one-dimensional approximation is impossible (segment 2), the process is moved on to a two-dimensional correction routine (STEPs 10 to 13).

In the one-dimensional correction routine, patterns within a distance S from the segments 1 and 3 are first extracted, respectively, in STEP 4. The patterns extracted as ones within the distance S from the segment 1 are shown in FIG. 2(b). The patterns extracted as ones within the distance S from the segment 3 are shown in FIG. 2(c).

Next, it is determined whether or not each pattern is registered in a correction table (STEP 5). If registered, a correction value is taken out for each segment in accordance with STEP 6. If not registered, a simulation as required is repeated in accordance with STEP 7 and STEP 8 and a correction value is thereafter obtained.

Figure 3:
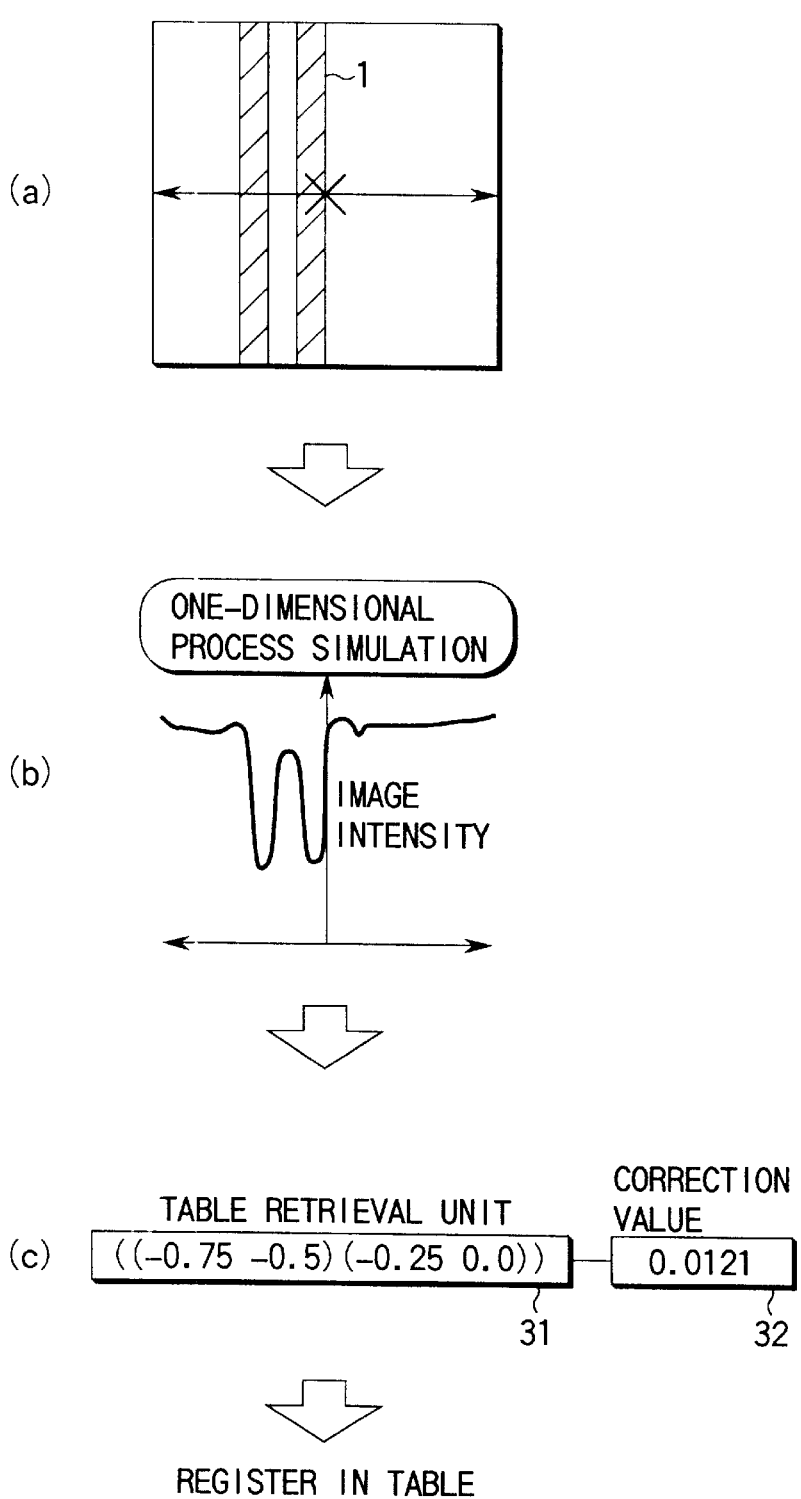
FIG. 3 shows a processing example in the mask data design method in the first embodiment.

FIG. 3(a) through (c) shows steps of a one-dimensional simulation and the calculation of a correction value.

If the patterns (FIG. 3(a)) extracted in respect of the segment 1 of FIG. 2(a) are not registered in the correction table, for example, a one-dimensional process simulation or another process simulation similar to the one-dimensional process simulation is conducted to the patterns (FIG. 3(b)).

One or a combination of an exposure simulation, a development simulation and an etching simulation is used as the process simulation. FIG. 3(b) shows an example of a one-dimensional process simulation image.

As a result, as shown in FIG. 3(c), a correction value is obtained for the segment 1 and the correction value 32 and pattern information 31 are registered as new data in the correction table.

Taking the segment 2 as an example, a two-dimensional simulation will be now described with reference to FIG. 4(a) through (c) (STEPs 6, 9 and 10 to 13).

Figure 4:
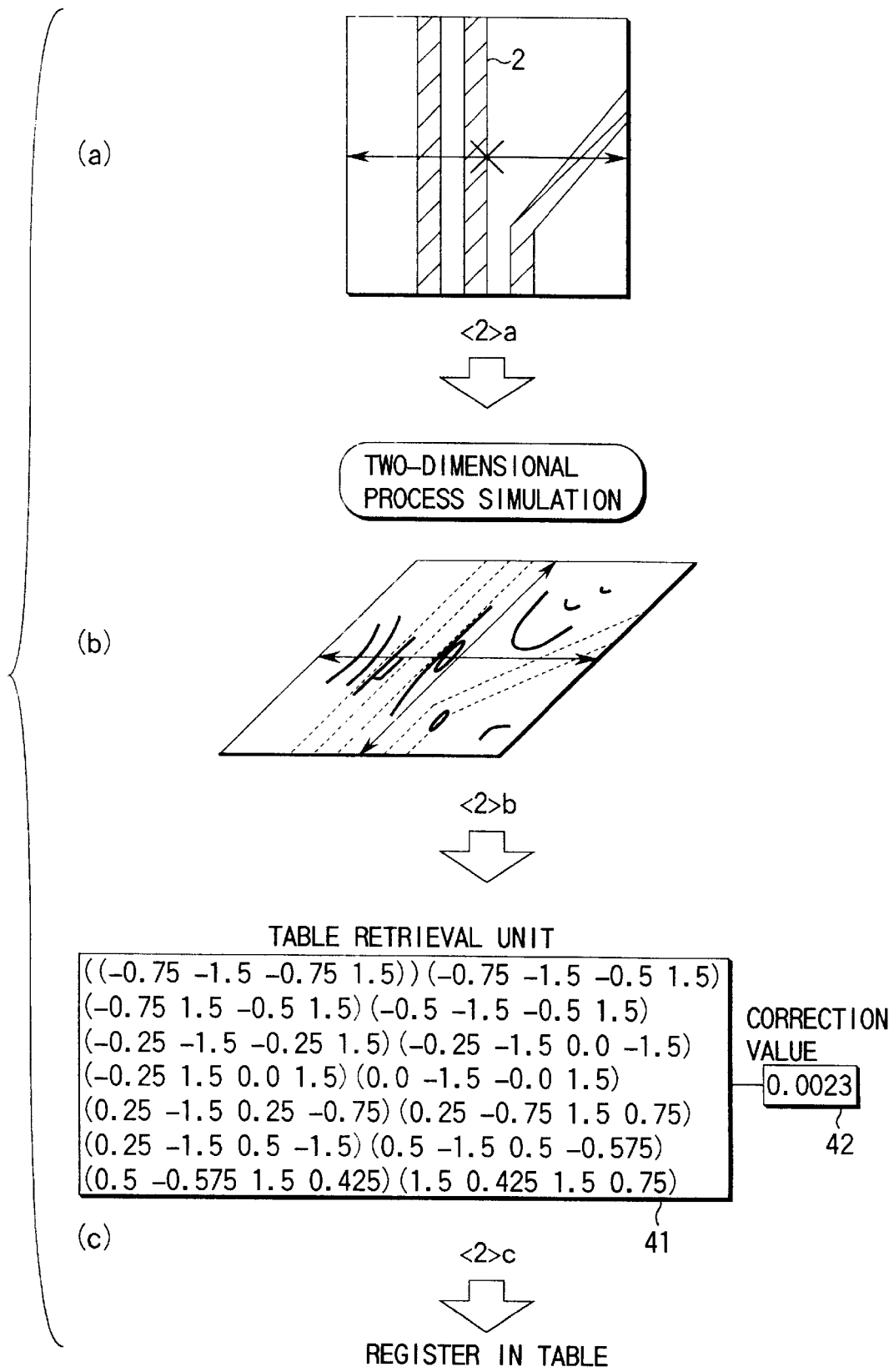
FIG. 4 shows a processing example of the mask data design method in the first embodiment.

In STEP 10, patterns which fall within the distance S from the correction target segment 2 are extracted (FIG. 2(d) and FIG. 4(a)). It is determined whether or not the extracted patterns are registered in the correction table (STEP 11). If registered, a two-dimensional correction value corresponding to the segment 2 is taken out in accordance with STEP 6.

If the extracted patterns are not registered in the correction table, a correction value is obtained in accordance with STEPs 12 and 13. Specifically, the extracted patterns (FIG. 4(a)) are subjected to a two-dimensional process simulation or another one similar to the two-dimensional process simulation (FIG. 4(b)). A correction value is calculated from the result. Next, a pattern location 41 and a correction value 42 are registered in the correction table (FIG. 4(c)).

After obtaining a correction value for the noted divided segment through the above-stated process (STEPs 2 to 14), each segment is corrected in accordance with a correction value in STEP 15 and corrected patterns are created in STEP 16.

The correction table may be used for both one-dimensional correction and two-dimensional correction. Alternatively, a one-dimensional correction table and a two-dimensional correction table may be prepared separately.

If an extracted pattern is not registered in the correction table, the method of obtaining a correction value for a one-dimensional pattern is not necessarily limited to a one-dimensional process simulation. It may use a transfer test of the one-dimensional pattern or a combination of this and a one-dimensional process simulation. Likewise, if an extracted pattern is not registered in the correction table, the method of obtaining a correction value for a two-dimensional pattern is not necessarily limited to a two-dimensional process simulation. It may use the transfer test of a two-dimensional pattern or a combination of this and a two-dimensional process simulation.

According to this embodiment, therefore, it is possible to obtain a correction value suited for a pattern at high speed. This makes it possible to manufacture a semiconductor device having a shape and a size closer to desired ones by using the optical proximity effect correction mask in this embodiment. As a result, it is possible to conduct the semiconductor device designing operation more effectively and to thereby reduce production costs.

[Second Embodiment]

Figure 5:
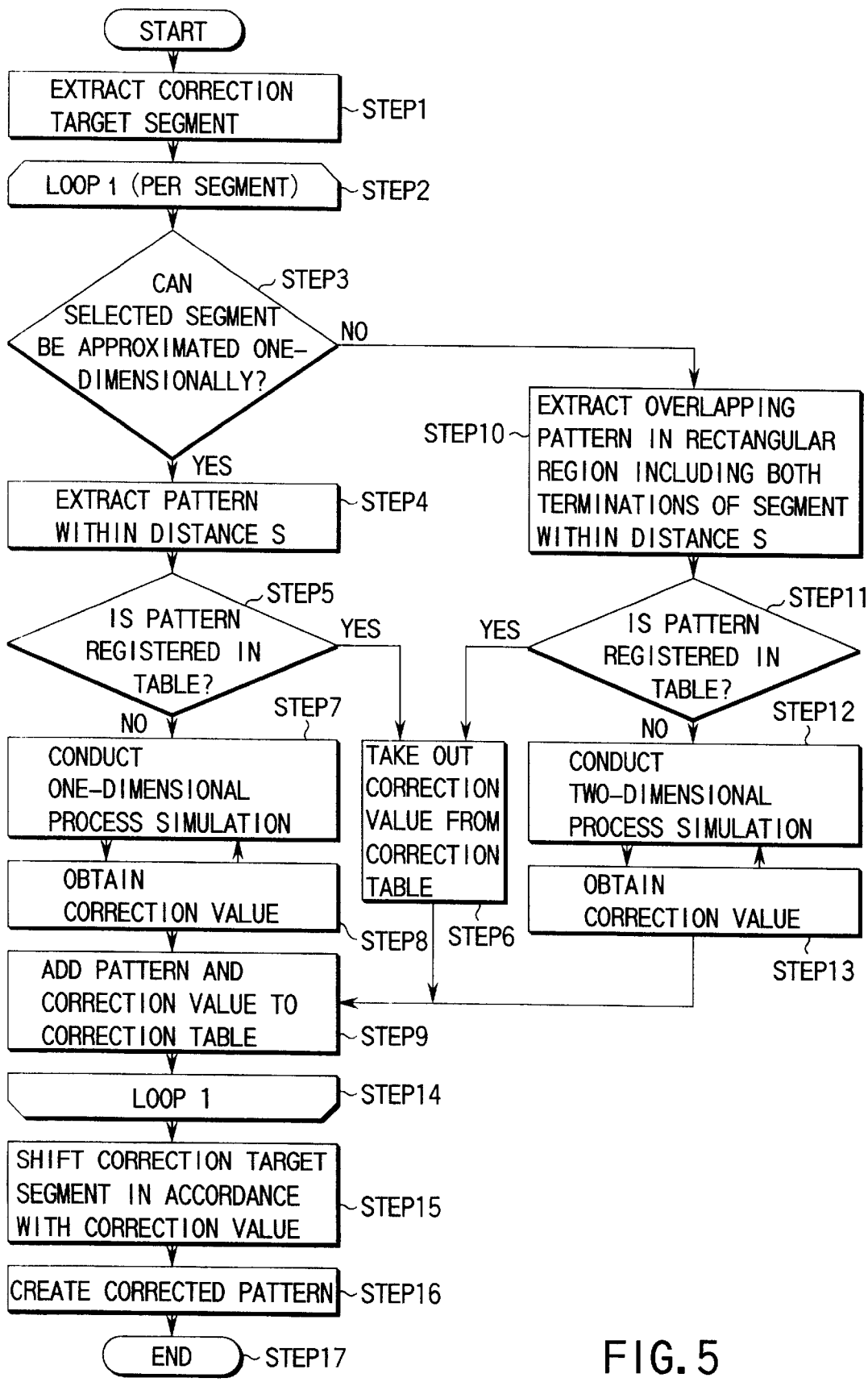
FIG. 5 is a flow chart showing a mask data design method in the second embodiment according to the present invention.

Next, the second embodiment according to the present invention will be described based on a flow chart shown in FIG. 5 as well as FIG. 6(a) through (e). It is noted that same constitutional elements as in the first embodiment are denoted by the same reference numerals and no detailed description will be given thereto.

The processing procedures in this embodiment are basically the same as those in the first embodiment. The second embodiment however differs from the first embodiment in extracted patterns obtained when carrying out a two-dimensional simulation.

Figure 6:
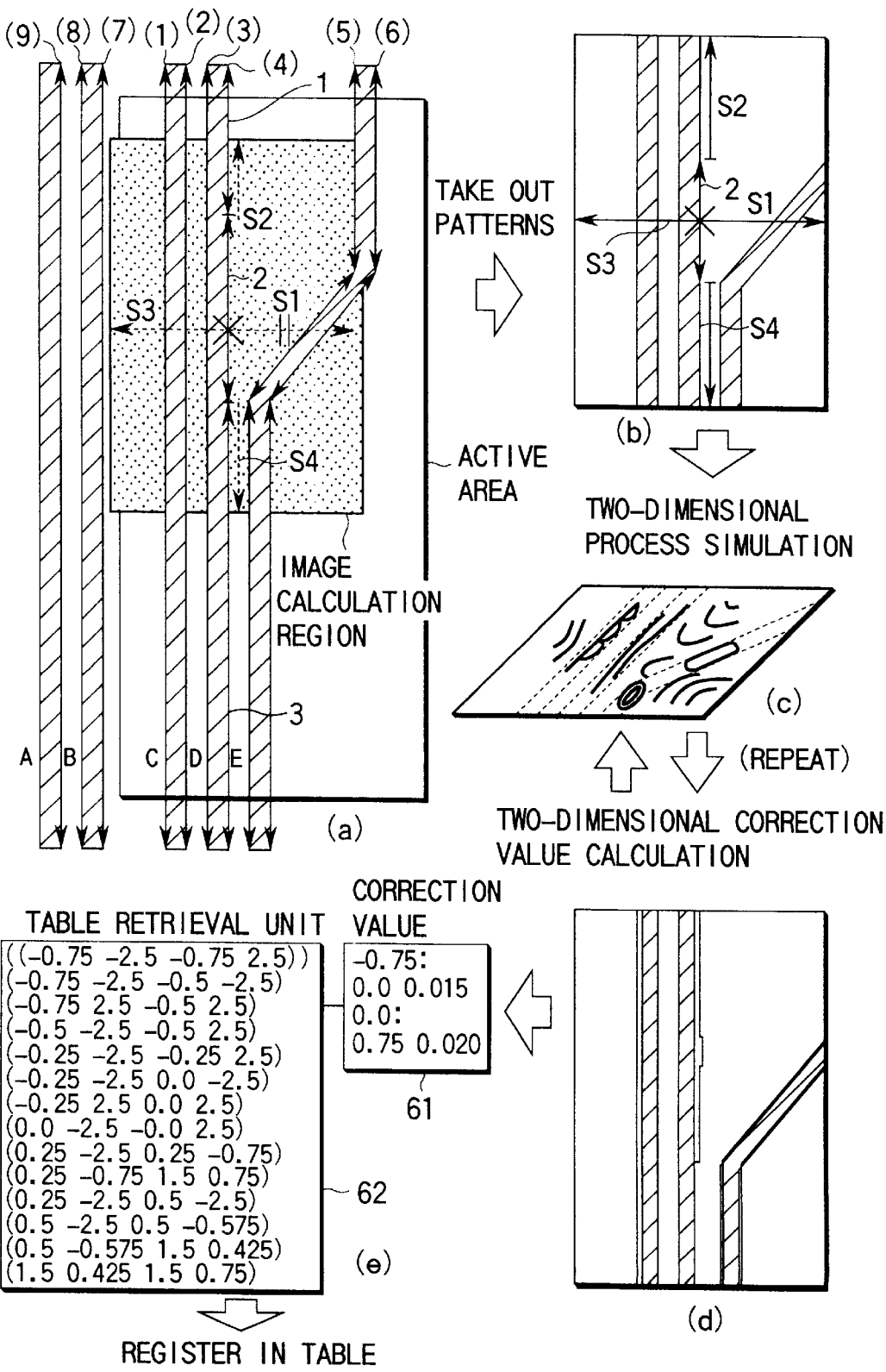
FIG. 6 shows a processing example of the mask data design method in the second embodiment.

More specifically, with reference to FIG. 6(a), if it is determined that a segment 2 cannot be approximated one-dimensionally based on the above-stated determination condition (b), as shown in FIG. 6(b), a rectangular region defined as follows is taken out as an image calculation region. That is, the rectangular region has left and right ends corresponding to positions with distances S1 and S2 from the segment 2 in rectilinear direction, respectively and upper and lower ends corresponding to positions with distances S2 and S4 from the both ends of the segment 2 in extended direction.

As shown in FIG. 6(c), a two-dimensional process simulation is carried out for that region using, for example, a software referred to as an OPTIMASK of Vector Technologies Company. As shown in FIG. 6(d), corrected patterns in response to the optical proximity effect are then calculated. If necessary, the simulation and the calculation of the corrected patterns are repeated until corrected patterns with high accuracy are obtained. A two-dimensional correction value 61 for the target segment 2 obtained from the corrected patterns as well as a pattern arrangement 62 is added to the correction table (FIG. 6(e)).

The correction value 61 indicates that the segment from the coordinates (0.0, −0.75) to coordinates (0.0, 0.0) is shifted right by 0.015 μm and the segment from the coordinates (0.0, 0.0) and coordinates (0.0, 0.75) is shifted right by 0.020 μm with the middle point of the correction target segment 2 defined as coordinates (0, 0).

In the above example, correction target segments are extracted and the segment that cannot be approximated one-dimensionally is corrected two-dimensionally. The following method may be also used. That is, correction targets are taken out in units of patterns, a pattern that cannot approximated one-dimensionally is subjected to pattern-matching from the outline of the pattern through the region in which the optical proximity effect occurs and the pattern is replaced with a corrected pattern as referring the correction table as disclosed in Jpn. Pat. Appln. SHUTSUGAN Publication No. 8-339636.

According to this embodiment, a more appropriate corrected pattern for the pattern that is not a one-dimensional pattern can be therefore obtained at high speed. In addition, by using the optical proximity effect correction mask in this embodiment, a semiconductor having a shape and a size closer to desired ones can be manufactured. This can realize more effective semiconductor designing process and therefore a reduction in production costs.

[Third Embodiment]

Another example in respect of a method of dividing a noted segment will next be described as the third embodiment. The same constitutional elements as in the first embodiment are denoted by the same reference symbols and no detailed description will be given thereto.

Figure 7:
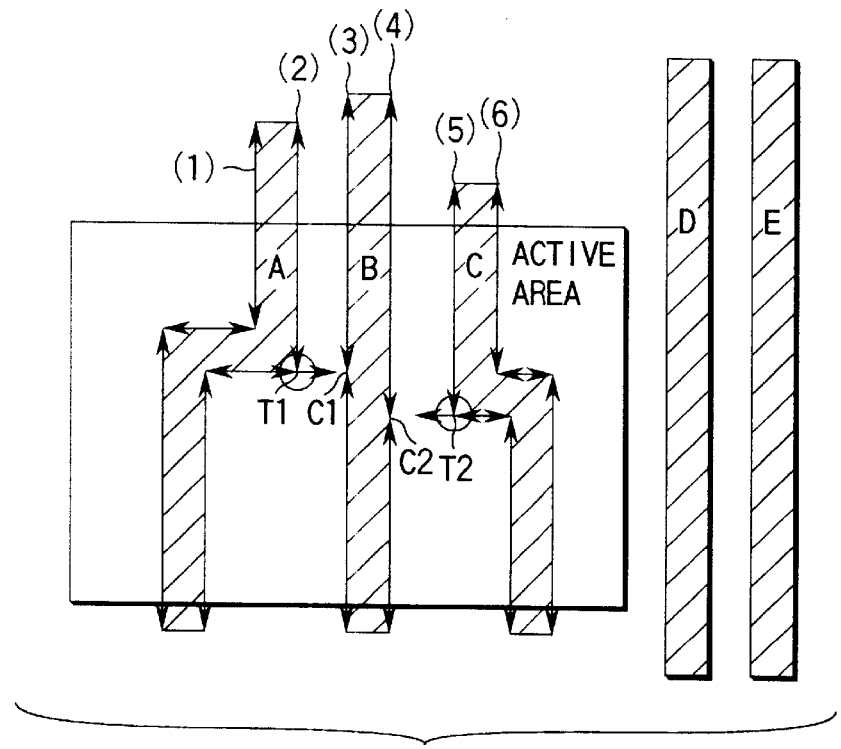
FIG. 7 shows an example of pattern division in a mask data design method in the third embodiment according to the present invention.

FIG. 7 is a view showing a method of dividing a first segment.

Namely, in the step of dividing a segment, with a region within a predetermined distance from a noted segment in the perpendicular direction observed, the noted segment is divided based on the intersections between the segment and perpendicular lines drawn from topmost vertices of adjacent segments opposite each other to the noted segment or based on the adjacency of the intersection such that a length of each divided segment is not shorter than a predetermined length.

Specifically, among patterns A to E on a correction target layer, edge segments (1) to (6) of the patterns A to C in the active area are correction target patterns. Description will be given, in particular, to the division of the edge segments (3) and (4) of the pattern B. That is to say, the edge segments (3) and (4) are divided at intersections C1 and C2 between the edge segments (3) and (4) and perpendicular lines drawn from topmost vertices T1 and T2 of the adjacent segments (2) and (5) opposite each other within a distance R in the perpendicular direction of the segment B, respectively.

By employing such a segment dividing method, division segments suited to the one-dimensional rule can be obtained only in appropriate number and pattern corrections can be made at higher speed and higher accuracy.

Figure 8:
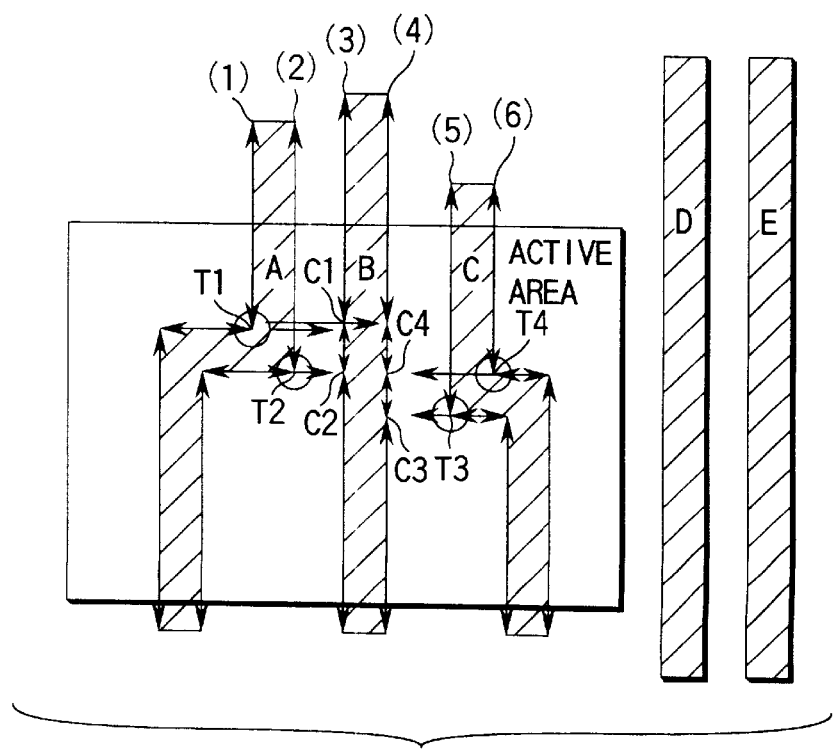
FIG. 8 shows an example of pattern division in a mask data design method in the third embodiment.

FIG. 8 is a view for showing a method of dividing the second segment.

Namely, in the step of dividing a segment, with patterns located within a predetermined distance R from a noted segment in perpendicular direction observed, the noted segment is divided based on the intersections between the noted segments and perpendicular lines drawn from the topmost vertices of patterns to the noted segments, respectively, or based on the adjacency of the intersection such that the length of each of the divided segments is not shorter than a predetermined length.

Specifically, edge segments (3) and (4) are divided at intersections C1 to C4 between the edge segments and perpendicular lines drawn from the topmost vertices T1 to T4 of the patterns A and C opposite to the pattern B within a distance R from the pattern B in perpendicular direction to the edges (3) and (4), respectively.

By employing such a segment dividing method, it is possible to respond to a complex arrangement environment flexibly compared to a case of FIG. 7.

[Fourth Embodiment]

In the fourth embodiment, description will be given to a case determining that a noted segment is not suited to the one-dimensional rule in the present invention.

That is, one of or a combination of two or more of the following conditions (a) to (d) is used as a one-dimensional rule in the present invention:

(a) The length of a divided noted segment falls within a predetermined range.

(b) An adjacent segment within a distance R from a noted segment in perpendicular direction is located in neither perpendicular nor parallel direction to the noted segment.
(c) A noted segment is located in neither perpendicular nor parallel direction to the mask data design coordinates axis.
(d) When a pattern including a noted segment is separated into a rectangle and a triangle, the ratio of the length to width of the rectangle including the noted segment falls within a predetermined range.

Figure 9:
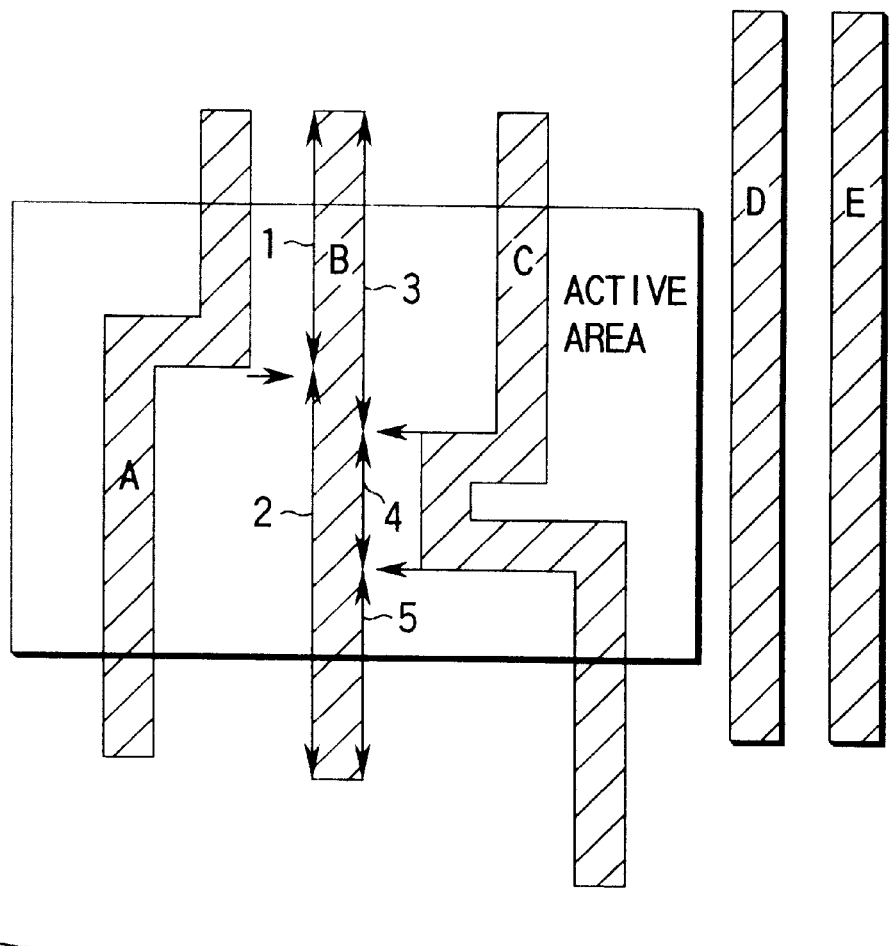
FIG. 9 shows a processing example of a mask data design method in the fourth embodiment according to the present invention.

In the fourth embodiment, a case where the condition (a) is applied will be described with reference to a layout shown in FIG. 9.

On this layout, among patterns A to E on a correction target layer, edges of the patterns A to C in an active area are correction target patterns and division segments indicated by arrows on both ends are obtained.

In this embodiment, the threshold of a length which cannot be one-dimensionally corrected under the condition (a) is set between the length of a segment 4 and that of a segment 5. At this time, the segments 1, 2, 3 and 5 are subjected to a one-dimensional process simulation and only the segment 4 is subjected to a two-dimensional process simulation, thereby obtaining correction values.

The short divided segment 4 is, in many cases, surrounded by complex patterns. By classifying division segments using this condition, more accurate correction values can be obtained.

[Fifth Embodiment]

In the fifth embodiment, description will be given to a case where the condition (c) stated-above is applied, with reference to layouts shown in FIG. 10(a) through (c).

Figure 10:
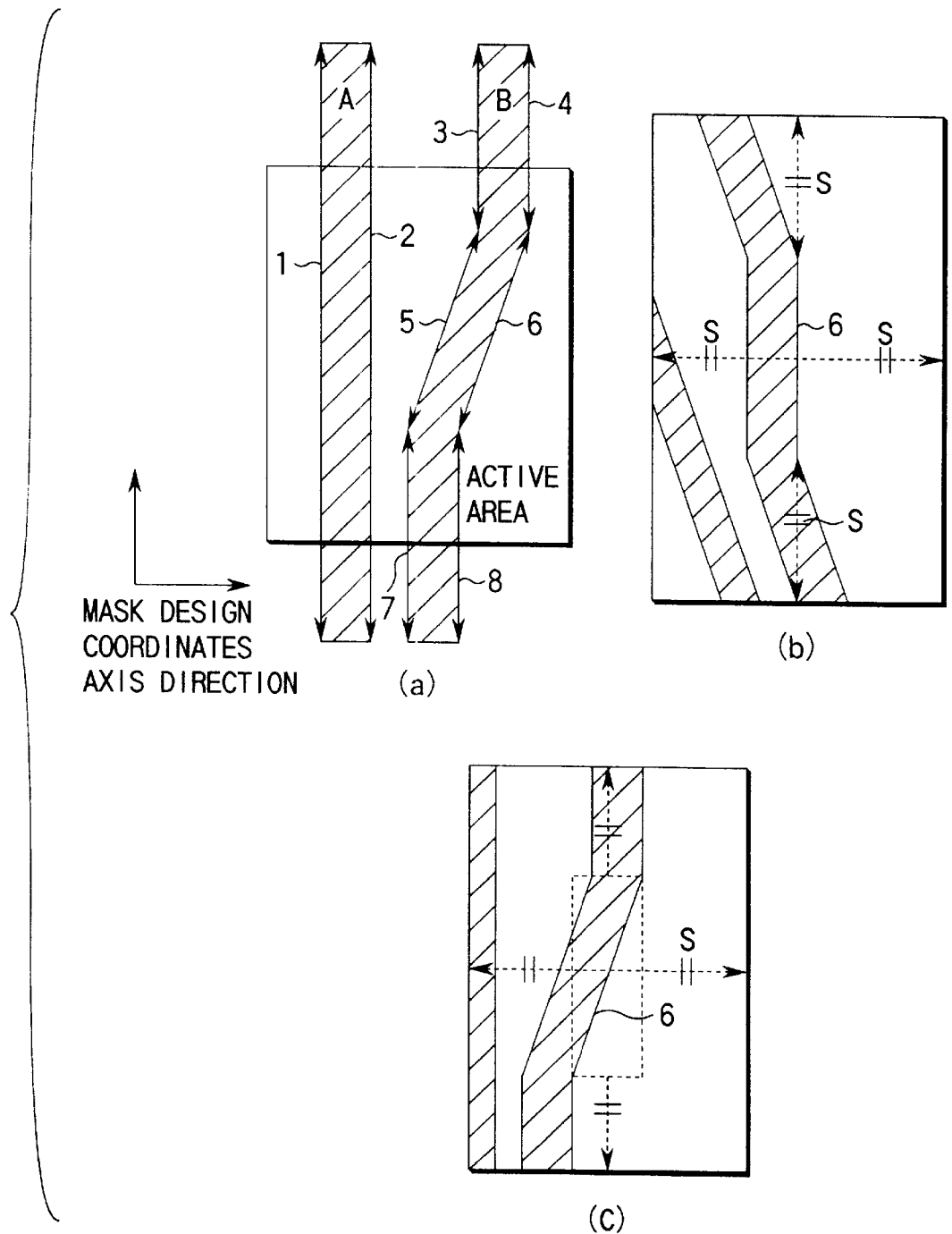
FIG. 10 shows a processing example of a mask data design method in the fifth embodiment according to the present invention.

Namely, among correction target segments 1 to 8 on a layout shown in FIG. 10(a), the segments located in neither perpendicular nor parallel direction to the mask coordinates axis are segments 5 and 6. Here, a case where the segment 6 is a noted segment will be, in particular, described.

As shown in FIG. 10(b), patterns which fall within a distance S from the segment 6 in horizontal and vertical directions are extracted from a layout of FIG. 10(a). A two-dimensional process simulation is carried out to this region and correction values are obtained. As for the range subjected to a process simulation, a range with a distance S from a rectangular or the triangle region including the segment 6 entirely may be extracted for the sake of the convenience of pattern extraction as shown in FIG. 10(c).

[Sixth Embodiment]

Figure 11:
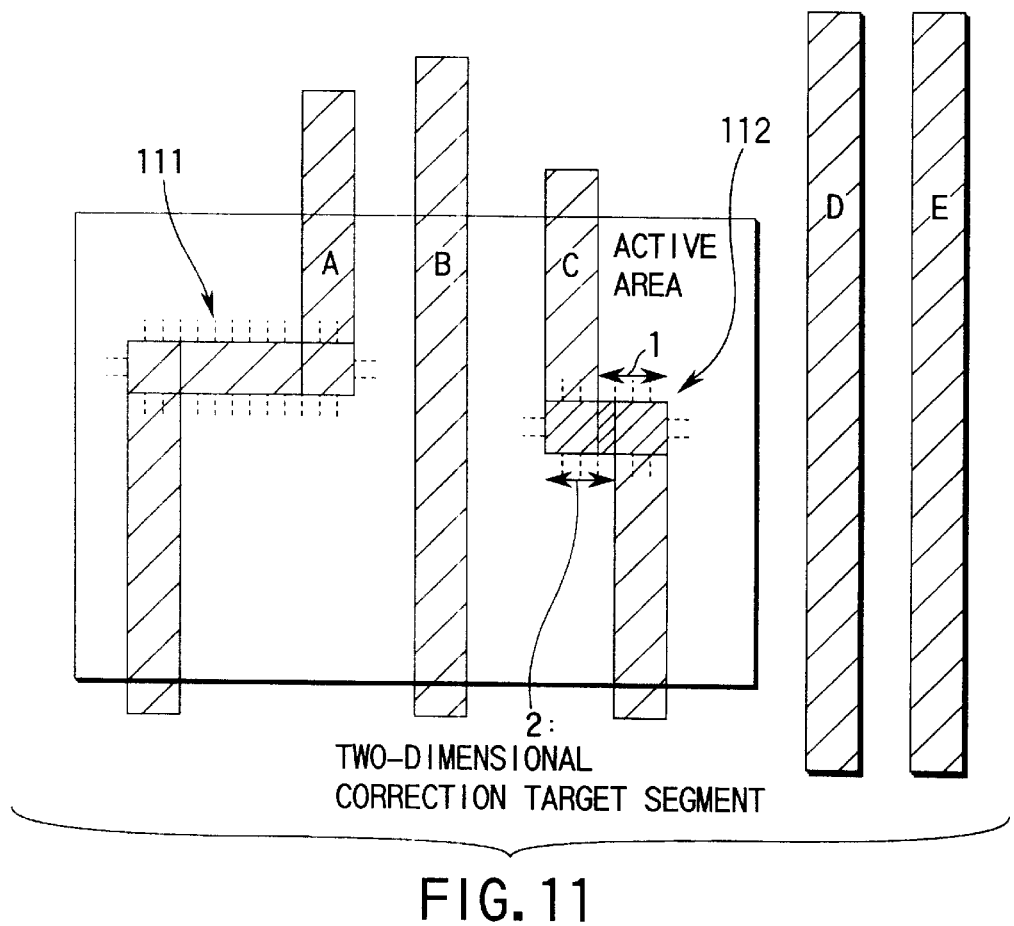
FIG. 11 shows a processing example of a mask data design method in the sixth embodiment according to the present invention.

In the sixth embodiment, description will be given to a case where the condition (d) stated above is applied, with reference to a layout shown in FIG. 11.

The condition (d) is that, if a pattern including a division segment is separated into a rectangle and a triangle and the ratio of the length to width of the rectangle including the segment falls within a predetermined range, then the segment is classified as a two-dimensional pattern.

In this case, patterns A to C included in an active area are divided into rectangles, respectively. Division segments included in respective rectangles are correction targets. Among the divided rectangles, the rectangles 111 and 112 which ratio of length to width is particularly small are noted and description will be given thereto.

The rectangle 111 is 1.3 $\mu$m long and 0.3 $\mu$m wide. The ratio of length to width is about 4.33. The rectangle 112 is, meanwhile, 0.7 $\mu$m long and 0.3 $\mu$m wide. The ratio of length to width is about 2.33. Here, the threshold of the length-to-width ratio for two-dimensional correction is set at 3.0. If the ratio is equal to or smaller than the threshold, a two-dimensional correction is conducted.

In this case, only the rectangle 112 has a ratio of length to width smaller than the predetermined threshold. Division segments 1 and 2 included in the rectangle 112 are subjected to two-dimensional correction.

The rectangle having a small ratio of length to width is, in most cases, surrounded by patterns of complex shape. By subjecting the segments included in the rectangle to two-dimensional correction, therefore, more accurate correction values can be obtained.

[Seventh Embodiment]

Figure 12:
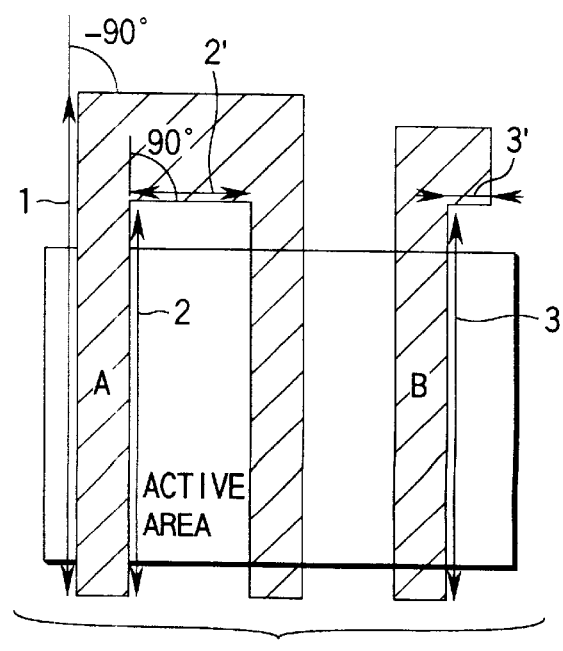
FIG. 12 shows a processing example of a mask data design method in the seventh embodiment according to the present invention.

In the seventh embodiment, description will be given to another case of the above-stated one-dimensional rule with reference to a layout shown in FIG. 12.

In this embodiment, among patterns on a correction target layer L1, division segments of patterns in an active area are correction target segments. Description will be given, in particular, to segments 1, 2 and 3. As for the segment 1, the angle made between the segment 1 and a segment contacting with the termination of the segment 1 is −90°. As for the segments 2 and 3, the angles made between the segments 2 and 3 and segments contacting with the terminations thereof are 90°, respectively. Assume that if the angle of the noted segment to the side of a pattern contacting with the termination of the noted segment is not more than 75°, the noted segment is subjected to one-dimensional correction. Based on the assumption, the segment 1 is to be one-dimensionally corrected.

Next, the segments 2 and 3 are noted. The length of a pattern side 2' contacting with the termination of the segment 2 is set at 1.5 $\mu$m and the length of a pattern side 3' contacting with the termination of the segment 3 is set at 0.2 $\mu$m. Assume that a segment is subjected to one-dimensional correction if the length from the segment to a pattern side contacting with the termination of the segment is not more than 1 $\mu$m. Based on the assumption, the segment 3 is to be one-dimensionally corrected and only the segment 2 is to be two-dimensionally corrected.

[Eighth Embodiment]

The eighth embodiment will next be described based on FIGS. 13A through 14(e).

Figure 13A:
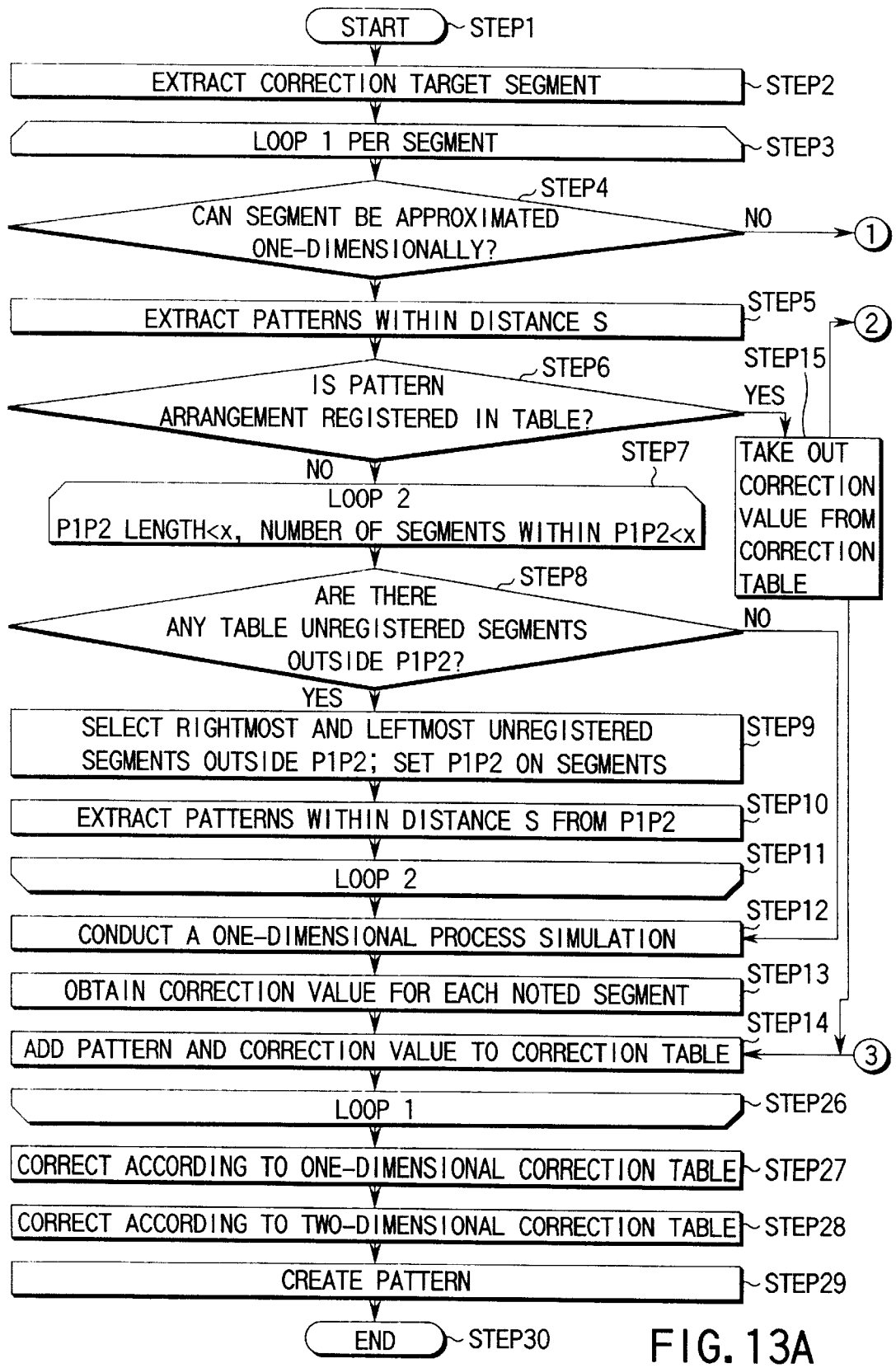
FIGS. 13A and 13B are flow charts showing a mask data design method in the eighth embodiment according to the present invention.
Figure 13B:
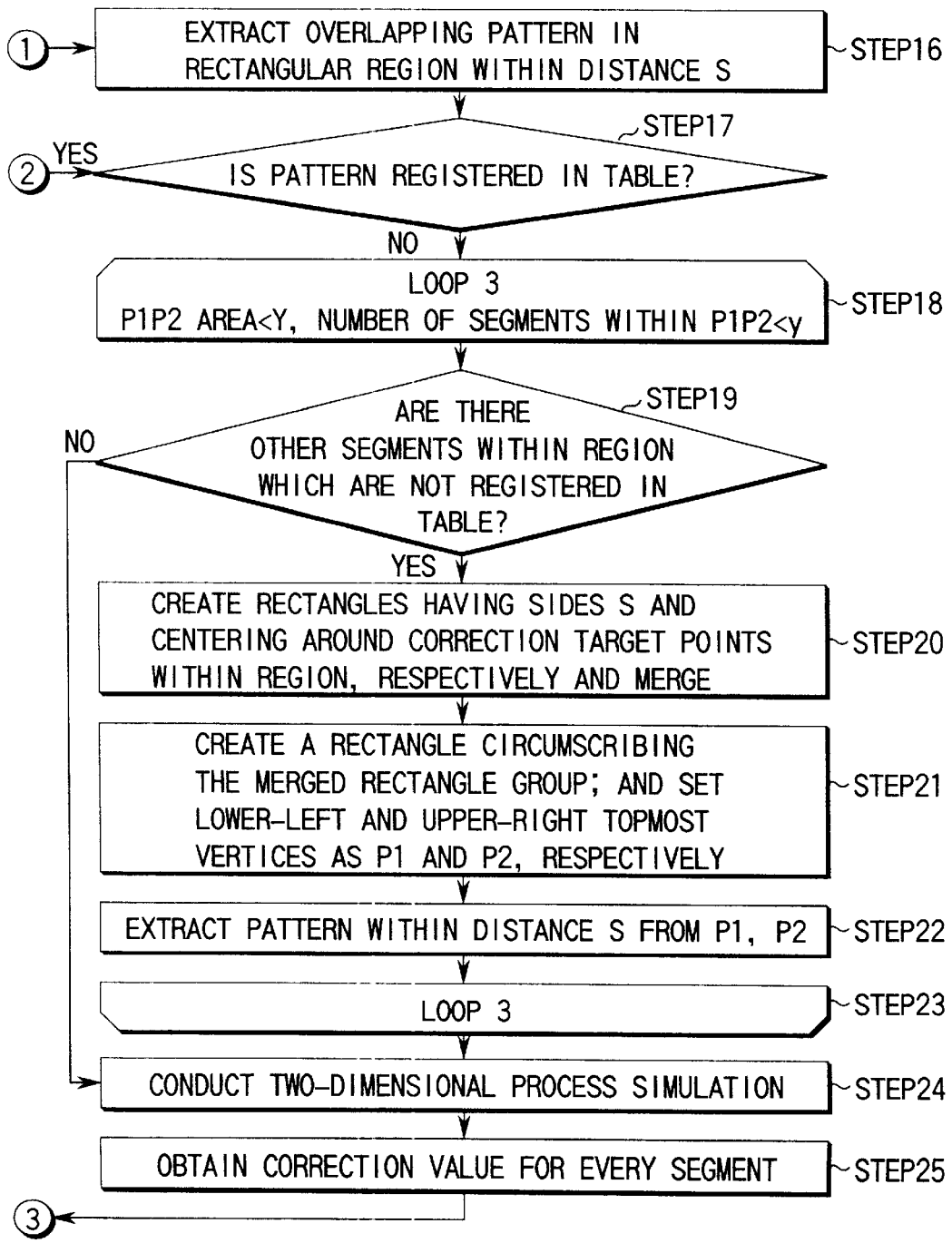
Figure 14:
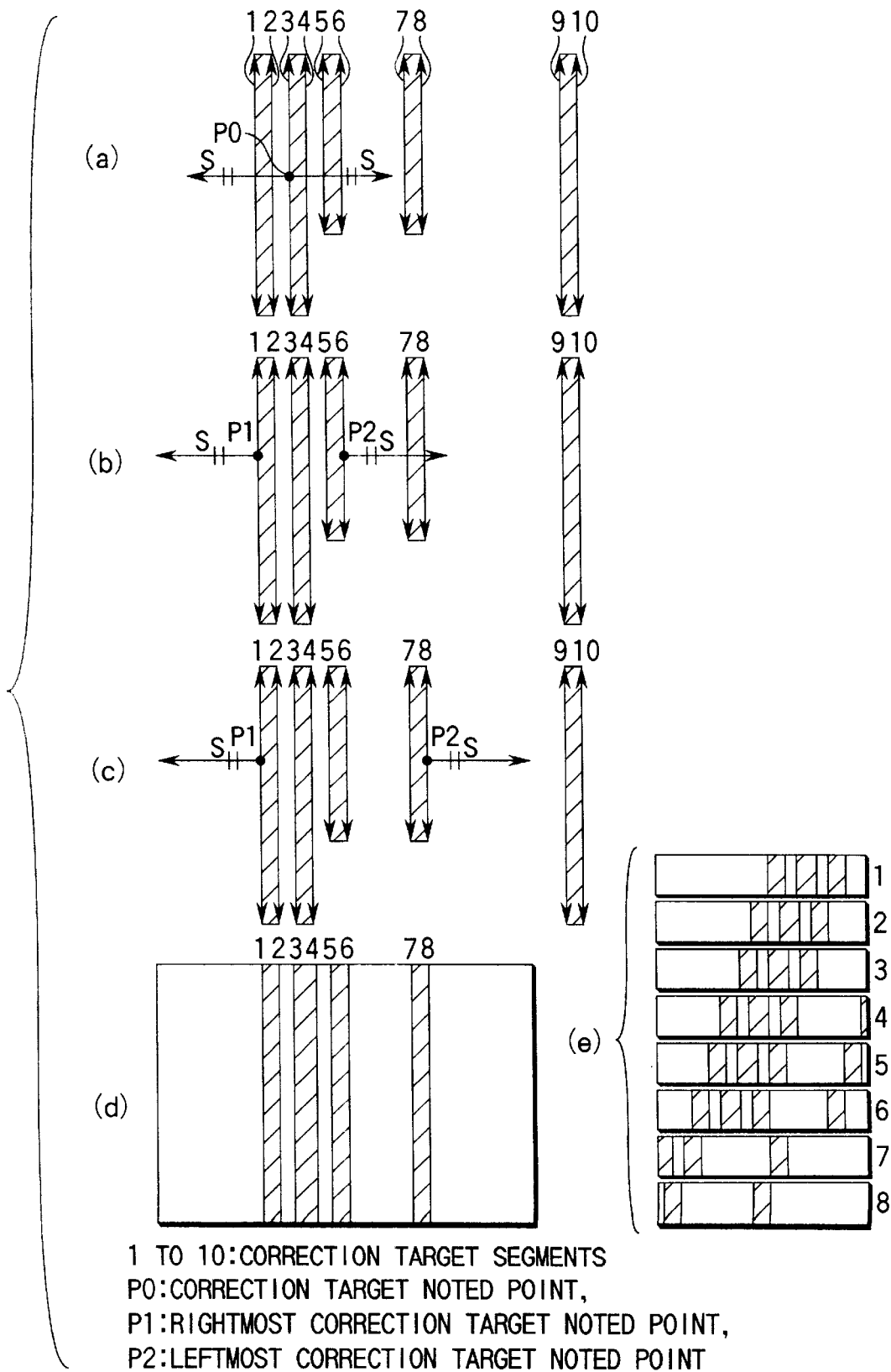
FIG. 14 shows pattern data used in the eighth embodiment.

FIGS. 13A and 13B are flow charts showing mask data correction procedures according to the eighth embodiment. FIG. 14(a) through (e) are views for describing a case where the correction procedures are applied to segments classified as one-dimensional patterns. FIG. 15(a) through (e) are views for describing a case where the correction procedures are applied to segments classified as one-dimensional patterns.

The same procedures as in the first embodiment will not be described in detail herein.

A layout shown in FIG. 14(a) indicates division segments 1 to 10 obtained by dividing a target segment by the method already described above. Assume that these division segments are to be determined as one-dimensional correction targets based on the above-stated one-dimensional rule. Also assume that none of the arrangements of patterns extracted within a distance S from the respective segments 1 to 5 are stored in the correction table.

First, correction noted segments 1 to 10 are extracted (in STEP 2) and one of the segments is then selected (in STEP 3). Here, a segment 3 shown in FIG. 14(a) is selected. It is determined in STEP 4 that the segment 3 can be approximated one-dimensionally based on the one-dimensional rule. Patterns within a distance from the segment 3 are extracted in STEP 5.

In this case, with a point $P_0$ put on the noted segment 3, patterns within a distance S from the $P_0$ in the right and left directions are examined. Next, it is examined whether or not the pattern arrangement on the segment 3 is shown in the correction table (in STEP 6). If shown, a correction value is taken out from the correction table (in STEP 15).

If the pattern arrangement on the segment 3 is not shown in the correction table, it is further examined whether or not pattern arrangements extracted within a distance S from the center of other segments 1, 2, 4, 5 and 6 which are within the distance S from the $P_0$ on the segment 3, are shown in the correction table (in STEP 8).

If all of the pattern arrangements for the segments 1, 2, 4, 5 and 6 are registered in the correction table, the segment 3 is subjected to, for example, a one-dimensional process simulation as in the case of the preceding embodiments and a correction value is calculated (in STEP 12). The pattern arrangement and correction value for the segment 3 are added to the table (in STEP 13 and STEP 14).

If either of the pattern arrangements for the segments 1, 2, 4, 5 and 6 is not registered in the correction table, points P1 and P2 are set on the outermost segments, respectively out of those for which pattern arrangements are not registered. In case of FIG. 14(a) through (e), none of the segments are registered in the correction table. As shown in FIG. 14(b), therefore, a point P1 is set on the leftmost segment 1 and a point P2 is set on the rightmost segment 6 (in STEP 9). Segments which fall within a distance S from the points P1 and P2 in the external direction are extracted (in STEP 10). The segments 7 and 8 are extracted in this case.

Next, it is examined whether or not pattern arrangements for these segments 7 and 8 are registered in the correction table (in STEP 8). If either of the segments is not registered, a point P1 and point P2 are set on leftmost and rightmost segments, respectively.

In FIG. 14(b), no segment exists on the left of P1 and a segment 8 is the outermost segment on the right of P2. As shown in FIG. 2(c), the position of P2 is changed onto the segment 8. Moreover, since no other segments exist in the range of a distance S from P1 and P2 outside, the process gets out of the loop in STEP 11.

The above-described steps (STEPs 7–11) are repeated until one of the following conditions are met. That is, there does not exist any new segment which is not shown in the correction table, outside the noted segment 3; the distances of outermost points P1 and P2 from $P_0$ exceed a predetermined distance X; or the number of segments within P1 and P2 exceeds a preset number. In this embodiment, the patterns shown in FIG. 14(d) are subjected to a one-dimensional process simulation.

Next, the patterns shown in FIG. 14(d) are corrected based on the process simulation (in STEP 12). The pattern arrangement (FIG. 14(e)) within distances S from the respective segments within the P1 and P2 as well as correction values in response to the pattern arrangement are added to the table (in STEPs 13 and 14).

Namely, compared with the first embodiment, the result registered in the correction table is the same, but the number of simulations for correction is only one. In other words, the table is referred to for patterns within the distance S from a noted segment and time-consuming calculation processing for calculating correction values is conducted for adjacent segments together. Due to this, more effective pattern matching is provided and calculation processing for calculating correction values takes less time.

Next, two-dimensional correction will be described, taking a layout shown in FIG. 15(a) as an example. Segments 1 to 8 are two-dimensional correction target segment on this layout. It is assumed that none of these segments are patterns which are not registered in the correction table.

While taking note of the segment 1, a flow chart shown in FIGS. 13A and 13B will be described.

Figure 15:
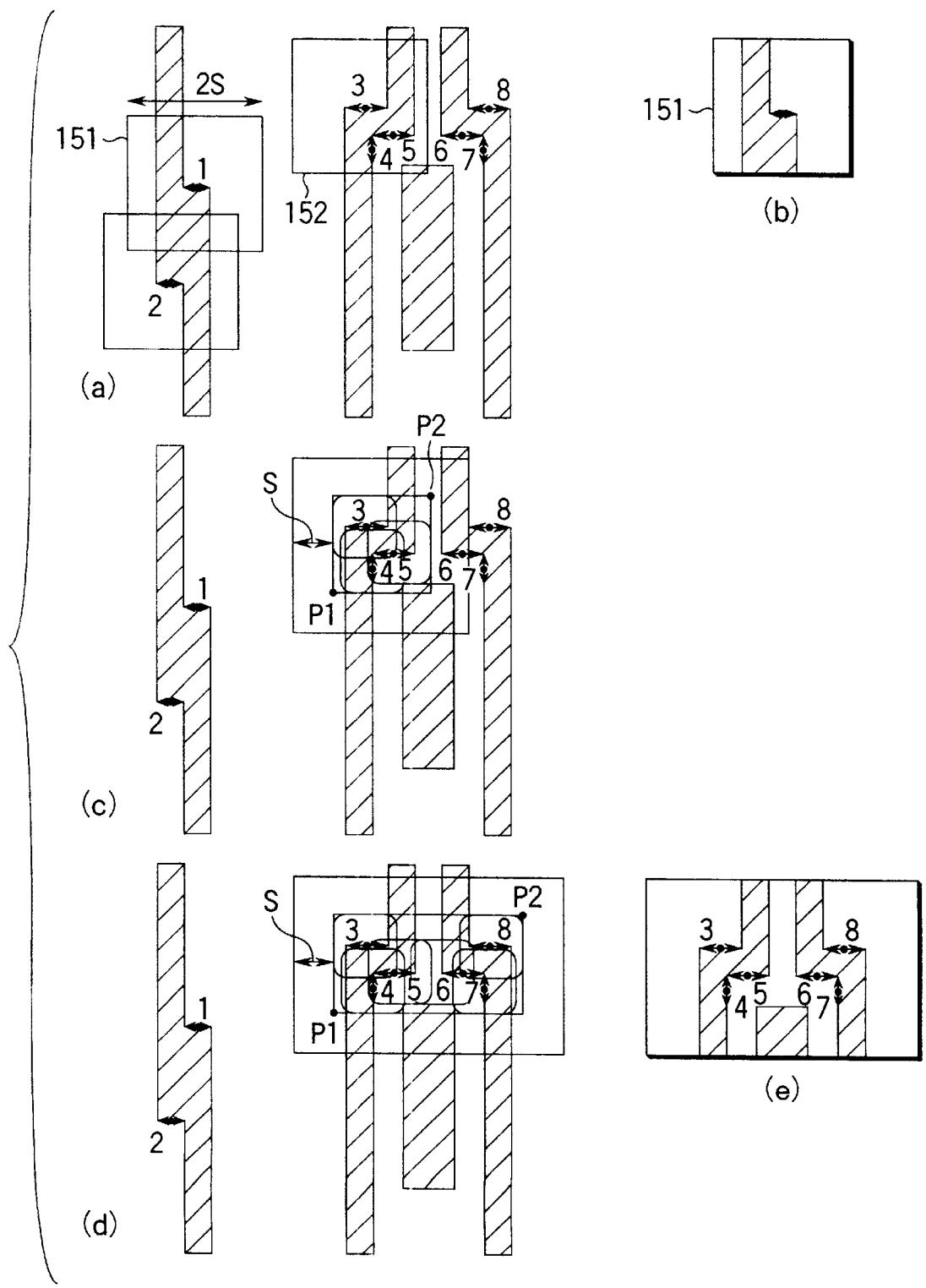
FIG. 15 shows a processing example of the mask data design method in the eighth embodiment.

First, a pattern arrangement 151 included in a rectangular region within a distance S from the middle point of the segment 1 is extracted in STEP 16 (FIG. 15(b)). Next, referring to the correction table, it is examined whether or not the pattern arrangement 151 is registered in the correction table in STEP 17.

If the pattern arrangement 151 has been already registered in the correction table, correction values on the registered pattern arrangement are taken out to thereby two-dimensionally correct the segment 1 (in STEP 15).

In this case, it is assumed that the pattern arrangement 151 is not registered in the correction table and the process enters a loop 3 (in STEP 18). In STEP 19, it is examined whether pattern arrangements for other segments in the region taken out in STEP 16 are registered in the correction table. In this case, it is assumed that unregistered segments do not exist within the region 151 of the segment 1. A two-dimensional process simulation is conducted to a region shown in FIG. 15(b) (in STEP 24) and correction values are obtained.

The flow chart of FIGS. 13A and 13B are applied to the segment 2 of FIG. 15(a). A rectangular pattern having a distance S from a center which is the middle point of the segment 2 corresponds to the pattern arrangement (FIG. 15(b)) already registered for the segment 1. The correction value is taken out from the correction table and the segment 2 is corrected (in STEP 15).

With a segment 3 shown in FIG. 15(a) noted, the flow of FIGS. 13A and 13B go forward. As shown in FIG. 15(a), a rectangular 152 within a distance S from the middle point of the segment 3 includes segments 4 and 5 which are not shown in the table. Therefore, in STEP 19, as shown in FIG. 15(c), rectangles having sides S and centering around correction target points (which are middle points of the segments 1 to 3) within the region are created, respectively (in STEP 20). A rectangle circumscribing the rectangles is created and lower-left and upper-right topmost vertices are defined as P1 and P2, respectively (in STEP 21).

Next, with a segment 3 shown in FIG. 15(a) noted, the flow of FIGS. 13A and 13B go forward, as well. As shown in FIG. 15(a), a rectangular region 152 within a distance S from the middle point of the segment 3 includes segments 4 and 5 which are not shown in the correction table. As shown in FIG. 15(c), therefore, rectangles having sides S and centering around correction target points (which are middle points of the segments 1 to 3) in the region are created, respectively (in STEP 20). A rectangle circumscribing the rectangle group is further created and lower-left and upper-right topmost vertices are defined as P1 and P2, respectively (in STEP 21).

The rectangle having a diagonal line between P1 and P2 is referred to as a rectangle P1–P2 hereinafter. Next, a region 153 within a distance S from the rectangle P1–P2 is extracted (in STEP 22) and, back to the STEP 19, it is examined whether or not segments which are not registered in the table exist within the region 153. In this case, a segment 6 shown in FIG. 15(c) is the segment which is not registered in the table.

Thereafter, the loop of STEPs 18 to 23 is repeated and the rectangle P1–P2 is expanded until the area of the rectangle P1–P2 exceeds a preset area Y, there exist no new segments which are not registered in the table, or the number of correction target points per unit area is less than a predetermined number (FIG. 15(d)).

In this case, the pattern shown in FIG. 15(e) which are finally obtained is subjected to a two-dimensional process simulation (in STEP 24). Correction values are obtained for the segments 1 to 8 included in the region of P1–P2 and the pattern arrangement as well as the correction values are added to the table (in STEPs 25, 14).

With the above structure, it is possible to prevent the redundancy of to-be-calculated regions for obtaining correction values to a minimum and thereby to obtain correction values suited to pattern shapes at high speed. Due to this, it is possible to manufacture a semiconductor device having a shape and a size closer to desired ones by using the optical proximity effect correction mask in this embodiment. As a result, it is possible to carry out designing process for the semiconductor device more effectively and to reduce relevant production costs.

[Ninth Embodiment]

The ninth embodiment will be described with reference to FIG. 16(a) through (d).

In the eighth embodiment, a method for preventing the redundancy of to-be-calculated regions for obtaining correction values to a minimum is described for a one-dimensional correction pattern and a two-dimensional correction pattern separately. In this ninth embodiment, if a one-dimensional correction region overlaps with a two-dimensional correction region, correction values or correction shapes for the two-dimensional correction are used in the region.

A correction method will be described, taking note of correction target segments 1 and 2 on a prior-to-correction pattern shown in FIG. 16(a).

It is first determined that the segment 1 can be approximated one-dimensionally. Correction values are calculated based on one-dimensional approximation patterns shown in FIG. 16(b). It is determined, meanwhile, that the segment 2 cannot be approximated one-dimensionally. Patterns included in a rectangular region having a predetermined distance $I_1$ from both terminations of the segment 2 in perpendicular and parallel directions are extracted two-dimensionally (FIG. 16(b)). A correction value or correction shape for the segment 2 is calculated based on the extracted patterns.

Figure 16:
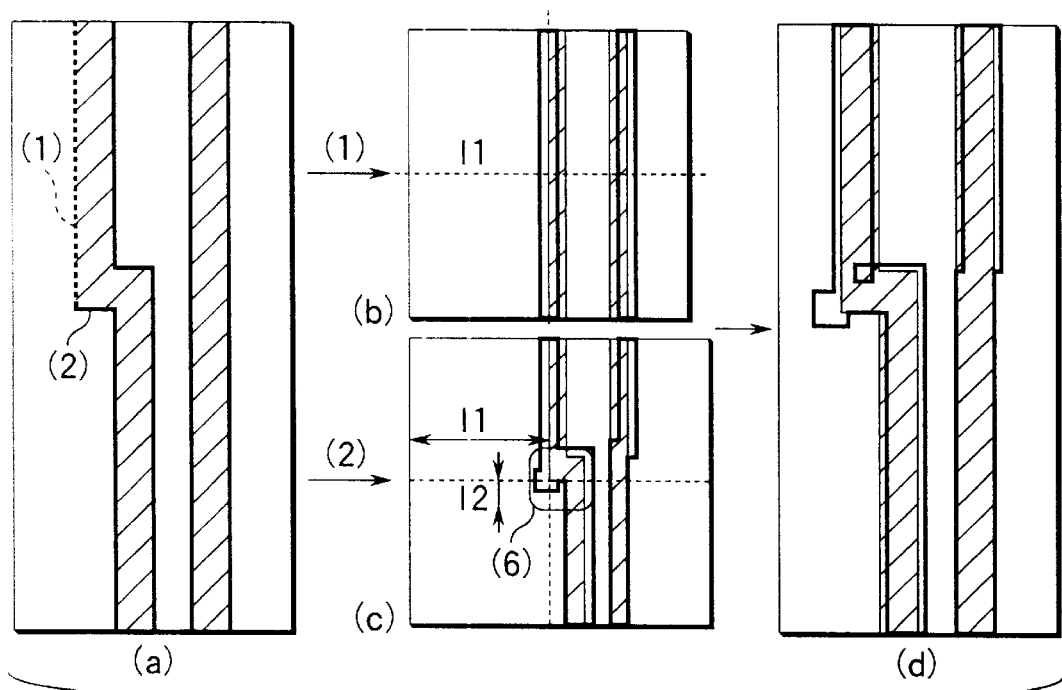
FIG. 16 shows a processing example of a mask data design method in the ninth embodiment according to the present invention.

In FIG. 16(c), a hatching denotes a design pattern shape prior to correction and a full line denotes a pattern shape after correction calculation.

At this time, a correction shape corresponding to the segment 2 is a pattern 161 included in a rectangular region having a predetermined distance 12 from both terminations of the segment 2 in perpendicular and parallel directions. Among correction shapes obtained from the correction calculation of FIG. 16(b) and (c), the shape of the pattern 161 in FIG. 16(c) is used as a correction shape for an overlapping region and after-correction patterns as shown in FIG. 16(d) are created. By adopting the result of the two-dimensional correction for the overlapping region, a highly accurate correction can be made.

Figure 17:
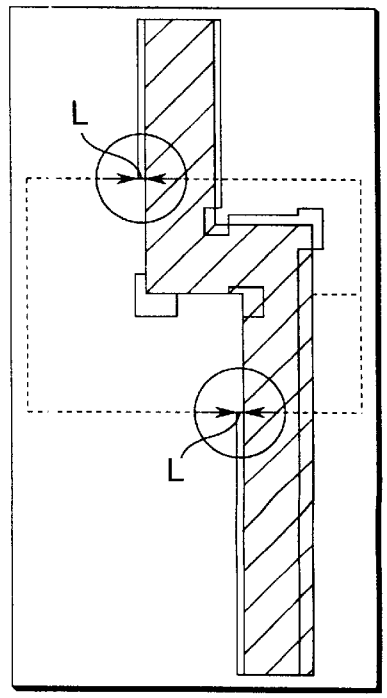
FIG. 17 shows a processing example of the mask data design method in the ninth embodiment.

In addition, it is possible to integrate a two-dimensional shape into the correction shape. As shown in FIG. 17, deviation occur to the boundary between the one-dimensional correction pattern and the two-dimensional correction pattern. If the deviation L is smaller than a preset value Z, the correction value for a segment contacting the boundary of the one-dimensional correction or two-dimensional correction may be matched to the other two-dimensional or one-dimensional correction. By so doing, it is possible to remove very small pattern which do not even influence patterns on a wafer and to thereby reduce mask data amounts.

[Tenth Embodiment]

In this embodiment, the structure of a mask data design apparatus applied to the mask data design method of the present invention will be described with reference to FIG. 18.

The apparatus of the present invention is realized by a computer which reads a program recorded in a recording medium such as a magnetic disc and executes operation process based on this program.

Figure 18:
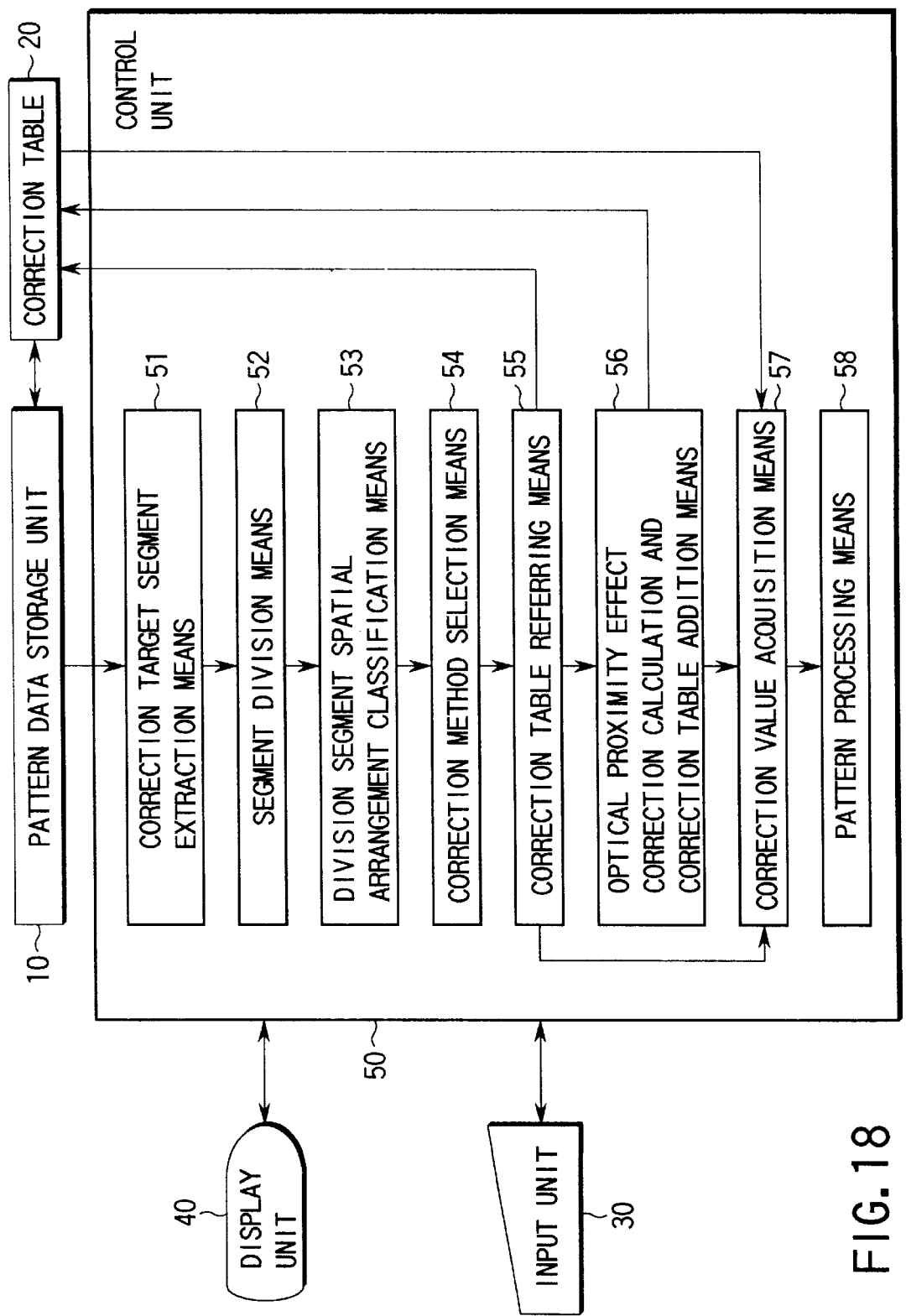
FIG. 18 is a block diagram showing the structure of a mask data design apparatus in the tenth embodiment according to the present invention.

In FIG. 18, reference numeral 10 denotes a pattern data storage unit, 20 denotes a correction table in which patterns and correction values corresponding to the patterns are registered, 30 denotes an input unit, 40 denotes a display unit, 50 denotes a control unit. The control unit 50 consists of correction target segment extraction means 51, segment division means 52, division segment spatial arrangement classification means 53, correction method selection means 54, correction table referring means 55, optical proximity effect correction calculation and correction table addition means 56, correction value acquisition means 57 and pattern processing means 58.

In this apparatus, pattern data inputted into the control unit 50 from the pattern data storage unit 10 is supplied to the correction target segment extraction means 51. Correction target segments are extracted by the means 51 from the pattern data. The correction target segments thus extracted are divided into lengths suited for correction by the segment division means 52. The divided segments are classified as either a one-dimensional pattern or a two-dimensional pattern in accordance with their spatial arrangements by the division segment spatial arrangement classification means 53. Correction methods are selected for the patterns thus classified in accordance with types by the correction method selection means 54.

The correction table 20 is referred to for a target pattern by the correction table referring means 55. If a pattern arrangement and correction values for the target pattern are registered in the correction table 20, the pattern is corrected in accordance with the table and correction values are obtained by the correction value acquisition means 57. If the target pattern is not registered in the correction table 20, an optical proximity effect correction calculation is conducted for the pattern including the segments by the optical proximity effect correction calculation and correction table addition means 56. The result is registered in the correction table 20 and the correction values are given to the correction value acquisition means 57. A correction value is obtained by referring to the table or by calculating an optical proximity effect correction. A correction value is given and a correction is made for every division segment by pattern processing means 58.

The method described in this embodiment is applicable to various types of apparatuses by using the method as a program capable of being executed by a computer and writing the program in a recording medium such as a magnetic disc (e.g., a floppy disc and a hard disc), an optical disc (e.g., a CD-ROM and a DVD) and a semiconductor memory, or to various types of devices by transmitting the method through a communication medium. The computer which realizes the present apparatus executes the above-stated processing by reading the program recorded in the recording medium while its operation is being controlled by the program.

According to the present invention, as described so far, it is possible to obtain correction values for all patterns suited for lithography conditions with a simple method by determining whether a one-dimensional correction or a two-dimensional correction should be conducted to a pattern itself, the surrounding pattern arrangement or both the pattern and the surrounding pattern arrangement for every pattern, and by obtaining correction values after conducting simulations, tests or a combination of simulations and tests. Therefore, it is possible to obtain an optical proximity effect correction mask pattern at high speed and high accuracy to thereby make it possible to manufacture a semiconductor effectively and to reduce production costs accordingly.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask data design method correcting a design pattern and using the corrected design pattern as mask data to improve fidelity of a transferred pattern onto a wafer, said method comprising the steps of:

extracting a correction target segment from said design pattern;

dividing the extracted segment into lengths suited for correction;

determining whether characteristics of spatial arrangement of a divided segment comply to a predetermined one-dimensional rule; and classifying, if the characteristics of spatial arrangement of the divided segment comply to the predetermined one-dimensional rule, said divided segment as a one-dimensional pattern and, if the characteristics of spatial arrangement of the divided segment does not comply to the predetermined one-dimensional rule, classifying said divided segment as a two-dimensional pattern; and correcting said divided segment in accordance with classified pattern types.

2. A mask data design method according to claim 1, wherein the characteristics of the spatial arrangement of the divided segment are defined by dimension-characteristics of at least one of the divided segment, an adjacent segment located within a predetermined distance from the divided segment in a perpendicular direction, and a positional relationship between a segment of interest and the adjacent segment.

3. A mask data design method according to claim 1, wherein the step of correcting said divided segment includes the steps of:

obtaining, if the characteristics of the spatial arrangement of said divided segment is classified as a one-dimensional pattern, a correction value for said divided segment by conducting one of a one-dimensional process simulation, a one-dimensional pattern transfer test, and a combination of the one-dimensional process simulation and the one-dimensional pattern transfer test for a certain region including the divided segment; and obtaining, if the characteristics of the spatial arrangement of said divided segment is classified as a two-dimensional pattern, a correction value for said divided segment by conducting one of a two-dimensional process simulation, a two-dimensional pattern transfer test, and a combination of the two-dimensional process simulation and the two-dimensional pattern transfer test for a certain region including the divided segment.

4. A mask data design method according to claim 3, wherein the step of correcting said divided segment further includes the step of, while using a database storing characteristics of spatial arrangement of segments and correction values corresponding to the segments, taking out a correction value suited for said divided segment from the database and correcting said divided segment if the characteristics of the spatial arrangement of said divided segment is stored in the database.

5. A mask data design method according to claim 3, wherein in the step of obtaining a correction value for said divided segment having the spatial arrangement classified as a one-dimensional pattern, the correction value is obtained for said divided segment by conducting one of the one-dimensional process simulation, the one-dimensional pattern transfer test and the combination of the one-dimensional process simulation and the one-dimensional pattern transfer test for a region including the divided segment and other segments located within a predetermined distance from the divided segment in perpendicular direction.

6. A mask data design method according to claim 3, wherein in the step of obtaining a correction value for the divided segment having the spatial arrangement classified as a two-dimensional pattern, the correction value for said divided segment is obtained by extracting a pattern included in a rectangular region having a predetermined distance from one point on the divided segment in perpendicular and horizontal directions and by conducting one of the two-dimensional process simulation, the two-dimensional pattern transfer test and the combination of the two-dimensional process simulation and the two-dimensional pattern transfer test to the extracted pattern.

7. A mask data design method according to claim 3, wherein in the step of obtaining a correction value for the divided segment having the spatial arrangement classified as a two-dimensional pattern, the correction value for said divided segment is obtained by two-dimensionally extracting a pattern included in a rectangular region having a predetermined distance from both terminations of the divided segment and from the divided segment and by conducting one of the two-dimensional process simulation, the two-dimensional pattern transfer test and a combination of the two-dimensional process simulation and the two-dimensional pattern transfer test to the extracted pattern.

8. A mask data design method according to claim 3, wherein one of the two-dimensional process simulation, the two dimensional pattern transfer test, and the combination of the two-dimensional process simulation and the two-dimensional pattern transfer test is conducted, and the thus obtained correction value is applied to a region adjacent to the divided segment classified as a two-dimensional pattern, even if the region includes the divided segment classified as a one-dimensional pattern.

9. A mask data design method according to claim 1, wherein in the step of correcting said divided segment, if a plurality of divided segments are densely located, a correction calculation is conducted for a region including the plurality of divided segments.

10. A mask data design method according to claim 1, wherein in the step of determining whether the characteristics of the spatial arrangement of the divided segment complies with a predetermined one-dimensional rule, it is determined that the arrangement of said divided segment can be approximated based on the one-dimensional rule when a length of the divided segment is more than a predetermined length.

11. A mask data design method according to claim 1, wherein in the step of determining whether the characteristics of the spatial arrangement of the divided segment complies with a predetermined one-dimensional rule, it is determined that the arrangement of said divided segment cannot be approximated to the one-dimensional rule when an adjacent segment within a distance R from a segment of interest in a perpendicular direction is located in neither perpendicular nor parallel direction of the segment of interest.

12. A mask data design method according to claim 1, wherein in the step of determining whether the characteristics of the spatial arrangement of the divided segment complies with a predetermined one-dimensional rule, it is determined that the arrangement of said divided segment cannot be approximated to the one-dimensional rule when a segment of interest is located in neither perpendicular nor parallel arrangement with respect to a mask data design coordinates axis.

13. A mask data design method according to claim 1, wherein in the step of determining whether the characteristics of the spatial arrangement of the divided segment complies with a predetermined one-dimensional rule, it is determined that the arrangement of said divided segment cannot be approximated to the one-dimensional rule when a pattern including a segment of interest is separated into rectangles and triangles wherein a ratio of a length to a width of the rectangle including the segment of interest falls within a predetermined range.

14. A mask data design method according to claim 1, wherein in the step of determining whether the characteristics of the spatial arrangement of the divided segment complies with a predetermined one-dimensional rule, it is determined that the arrangement of said divided segment cannot be approximated to the one-dimensional rule when a segment is in contact with a termination of a segment of interest with an angle more than a preset angle, with an extension of the segment of interest, and when a length of the segment contacting with the segment of interest is more than a predetermined length.

15. A mask data design method according to claim 1, wherein
in the step of dividing said segment, while observing within a predetermined distance from a noted segment in a perpendicular direction, the noted segment is divided such that a length of a segment after being divided is not shorter than a predetermined length based on an intersection between perpendicular lines drawn to the noted segment from topmost vertices of adjacent patterns opposite to a pattern including the noted segment or based on an adjacency of the intersection.

16. A mask data design method according to claim 1, wherein
in the step of dividing said segment, a noted segment is divided such that a length of a segment after being divided is not shorter than a predetermined length based on an intersection between perpendicular lines drawn to the noted segment from topmost vertices of a pattern, located within a predetermined range R in a direction perpendicular to the noted segment.

17. A mask data design apparatus for correcting a design pattern and using the corrected design pattern as mask data to improve fidelity of a transferred pattern to the design pattern, said apparatus comprising:
means for extracting a correction target segment from the design pattern;
means for dividing the extracted segment into lengths suited for correction;
means for classifying characteristics of spatial arrangement of divided segments into one-dimensional patterns and two-dimensional patterns depending on whether the characteristics of the spatial arrangement of the divided segments can be approximated to a one-dimensional rule; and
means for making corrections in accordance with types of classified segments.

18. A computer program product capable of being read by a computer and storing a program for creating mask data by correcting a design pattern to improve fidelity of a transferred pattern to the design pattern, said program executing the steps of:
extracting a correction target segment from the design pattern;
dividing the extracted segment into lengths suited for correction;
classifying characteristics of spatial arrangement of divided segments into one-dimensional patterns and two-dimensional patterns depending on whether the characteristics of the spatial arrangement of the divided segments can be approximated to a one-dimensional rule; and
making corrections in accordance with types of classified segments.

* * * * *

UNITED STATES PATENT AND TRADEMARK OFFICE
CERTIFICATE OF CORRECTION

PATENT NO. : 6,243,855 B1  
DATED : June 5, 2001  
INVENTOR(S) : Sachiko Kobayashi et al.

It is certified that error appears in the above-identified patent and that said Letters Patent is hereby corrected as shown below:

<u>Title page,</u>
Item [54], Title, "METHOD" should read
-- CONDUCTING AUTOMATIC CORRECTION PROCESSING --.

Signed and Sealed this

Twenty-second Day of January, 2002

Attest:

Attesting Officer

JAMES E. ROGAN
*Director of the United States Patent and Trademark Office*